(12) United States Patent
Lee et al.

(10) Patent No.: US 12,740,331 B2
(45) Date of Patent: Sep. 15, 2026

(54) JOSEPHSON JUNCTION DEVICE AND METHOD OF MANUFACTURING THE SAME

(71) Applicant: Samsung Electronics Co., Ltd., Suwon-si (KR)

(72) Inventors: Jaehyeong Lee, Suwon-si (KR); Jinhyoun Kang, Suwon-si (KR); Jaeho Shin, Suwon-si (KR); Daeseok Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 678 days.

(21) Appl. No.: 18/116,681

(22) Filed: Mar. 2, 2023

(65) Prior Publication Data

US 2024/0099161 A1 Mar. 21, 2024

(30) Foreign Application Priority Data

Sep. 19, 2022 (KR) ........................ 10-2022-0118152

(51) Int. Cl.
*H10N 60/80* (2023.01)
*H10N 60/01* (2023.01)
*H10N 60/12* (2023.01)

(52) U.S. Cl.
CPC ....... *H10N 60/805* (2023.02); *H10N 60/0912* (2023.02); *H10N 60/12* (2023.02)

(58) Field of Classification Search
None
See application file for complete search history.

(56) References Cited

U.S. PATENT DOCUMENTS 5,354,734 A * 10/1994 Tanaka ............... H10N 60/0941 257/E39.015
10,784,432 B2 9/2020 Rosenblatt et al.
(Continued)

FOREIGN PATENT DOCUMENTS

JP 5-152628 A 6/1993
JP 2000-277820 A 10/2000
(Continued)

OTHER PUBLICATIONS

Kim, Sunmi, et al. "Enhanced coherence of all-nitride superconducting qubits epitaxially grown on silicon substrate." *Communications Materials* vol. 2. Issue 1 (2021): 98. pp. 1-7.

*Primary Examiner* — Aaron J Gray
(74) *Attorney, Agent, or Firm* — NSIP Law

(57) ABSTRACT

A Josephson junction device and a method of manufacturing the Josephson junction device are disclosed. The Josephson junction device includes a substrate having a top surface and a trench recessed below the first surface, wherein sidewalls of the substrate define sidewalls of the trench; a first superconducting electrode formed on the top surface of the substrate with sidewalls further defining the sidewalls of the trench; a tunneling thin film formed over the sidewalls of the substrate and over the sidewalls of the first superconducting electrode; and a second superconducting electrode formed in the trench in contact with the tunneling thin film and with top surface above the top surface of the substrate, wherein a superconducting tunnel junction is formed between the first superconducting electrode and the second superconducting electrode through the tunneling thin film.

17 Claims, 30 Drawing Sheets

(56) References Cited

U.S. PATENT DOCUMENTS

| | | | | |
|---|---|---|---|---|
| 2008/0070325 | A1 | 3/2008 | Tolpygo | |
| 2014/0054552 | A1 | 2/2014 | Tolpygo | |
| 2017/0033273 | A1 | 2/2017 | Chang et al. | |
| 2018/0358537 | A1 | 12/2018 | Brink et al. | |
| 2018/0358538 | A1 | 12/2018 | Brink et al. | |
| 2019/0130302 | A1 | 5/2019 | Hertzberg et al. | |
| 2020/0321508 | A1* | 10/2020 | Hart | B82Y 10/00 |
| 2021/0151659 | A1* | 5/2021 | Adiga | H10N 60/0912 |
| 2023/0180630 | A1* | 6/2023 | Tokunari | H10N 60/0688<br>505/410 |

FOREIGN PATENT DOCUMENTS

| | | | | |
|---|---|---|---|---|
| JP | 2021-500739 A | 1/2021 | | |
| JP | 2021-518655 A | 8/2021 | | |
| WO | WO-2019117929 A1 * | 6/2019 | | H10D 48/3835 |

* cited by examiner

JOSEPHSON JUNCTION DEVICE AND METHOD OF MANUFACTURING THE SAME

CROSS-REFERENCE TO RELATED APPLICATIONS

This application is based on and claims priority under 35 U.S.C. § 119 to Korean Patent Application No. 10-2022-0118152, filed on Sep. 19, 2022, in the Korean Intellectual Property Office, the disclosure of which is incorporated by reference herein in its entirety.

BACKGROUND

1. Field

Josephson junction devices and methods of manufacturing the Josephson junction devices are described herein.

2. Description of Related Art

Quantum bits, that is, qubits, are basic units of information used for quantum computers. Qubits may represent at least two different quantities. Depending on context, the term "qubit" may mean an actual physical device, in which information is stored, or an information unit extracted from a physical device thereof.

A classical information storage device may encode two different physical states generally labeled as "0" and "1". In a classical information storage device, a quantity used to encode a bit state follows the classical laws of physics.

A qubit may also include two different physical states labeled as "0" and "1". In a qubit device, the physical quantities used to encode the bit state follow the laws of quantum physics. When a physical quantity used to store these states mechanically operates like a quantum (exhibits quantum behavior), a quantum information storage device may be in a superposition of "0" and "1". Unlike normal bits, qubits have amplitude and phase like waves, and entanglement between qubits is possible. Thus, it is possible to have a different type of operation structure from that of bits in classical storage devices. In particular, qubits may be applied to data science and quantum cryptography, including quantum chemistry, which is the background of quantum mechanics.

Quantum systems used in quantum computers include optical based, superconducting based, ion trap based, and topological materials based quantum systems. Among these quantum systems, a superconducting based quantum system may use a Josephson junction device as a qubit. That is, the Josephson junction device may be used as a basic unit of a superconducting based quantum computing process.

SUMMARY

Provided are a Josephson junction device scalable to multiple qubits by reduced process errors and a method of manufacturing the Josephson junction device.

Additional aspects will be set forth in part in the description which follows and, in part, will be apparent from the description, or may be learned by practice of the presented embodiments of the disclosure.

According to an aspect of the disclosure, a Josephson junction device includes a substrate having a first surface and a trench recessed below the first surface, wherein sidewalls of the substrate define sidewalls of the trench; a first superconducting electrode formed on the first surface of the substrate to be adjacent to the trench; a tunneling thin film formed over the sidewalls of the substrate and over a side surface of the first superconducting electrode adjacent to the trench; and a second superconducting electrode formed in the trench in contact with the tunneling thin film and with a top surface above the first surface of the substrate, wherein a superconducting tunnel junction is formed between the first superconducting electrode and the second superconducting electrode through the tunneling thin film.

A depth of the trench from the first surface of the substrate to a bottom surface of the second superconducting electrode may be D1, a distance from the first surface to the top surface of the first superconducting electrode may be D2, a vertical thickness of the second superconducting electrode may be D3, and the second superconducting electrode may satisfy $D1<D3\leq D1+D2$.

A protective layer of material may protect the tunneling thin film above the first superconducting electrode.

The protective layer may be formed together with the second superconducting electrode.

Trench sidewalls may include a first sidewall and a second sidewall facing each other, a first junction formed by the tunneling thin film on the first sidewall, and a second junction formed by the tunneling thin film on the second sidewall, wherein junction areas of the first junction and the second junction are different from each other.

A horizontal width of the second superconducting electrode contacting the tunneling thin film on the first sidewall may be different from a width of the second superconducting electrode contacting the tunneling thin film on the second sidewall, so that the junction areas of the first junction and the second junction are different from each other.

The first junction may have a first area of contact between the second superconducting electrode and the tunneling thin film on the first sidewall, the second junction may have a second area of contact between the second superconducting electrode and the tunneling thin film on the second sidewall, and the first area and the second area are different from each other equal to or more 5 times.

The first area and the second area are different from each other equal to or more 10 times.

The junction area of the first junction may be less than the junction area of the second junction so that the first junction functions as a main junction and the second junction functions as a sub junction.

A conductive layer may be formed by doping a part of the substrate on the side of the second sidewall to reinforce concentration of a load on the main junction.

The first superconducting electrode or the second superconducting electrode may have a vertical thickness less than or equal to about 200 nm.

The first superconducting electrode or the second superconducting electrode may include titanium nitride, niobium, niobium nitride, or titanium niobium nitride.

The tunneling thin film may include a metal, a semiconductor, or an insulator.

The tunneling thin film may include aluminum oxide (AlO), hafnium oxide (HfO), silicon nitride (SiN), or aluminum nitride (AlN).

In one general aspect, a method of manufacturing a Josephson junction device includes forming a trench recessed below a first surface of a substrate and having two open ends; forming a first superconducting electrode on the first surface of the substrate to be adjacent to the trench; and forming a tunneling thin film on a sidewall of the trench of the substrate and a side surface of the first superconducting electrode adjacent to the trench; and forming a second superconducting electrode in the trench that protrudes with respect to the first surface and may be in contact with the tunneling thin film.

The forming of the tunneling thin film and the second superconducting electrode may include sequentially depositing a tunneling thin film layer for the tunneling thin film and a superconducting material layer for the second superconducting electrode to cover the first superconducting electrode and the trench, and forming the superconducting material layer to protrude above the first surface in the trench, applying a mask pattern corresponding to the second superconducting electrode on the superconducting material layer to pattern the superconducting material layer and the tunneling thin film layer, and removing the mask pattern, wherein the tunneling thin film may be formed over the sidewall of the trench of the substrate and the side surface of the first superconducting electrode adjacent to the trench, and the second superconducting electrode may be in contact with the tunneling thin film and protrudes above the first surface in the trench.

A depth of the trench from the first surface of the substrate to a bottom surface of the second superconducting electrode may be D1, a distance from the first surface to an upper surface of the first superconducting electrode may be D2, a vertical thickness of the second superconducting electrode may be D3, and it may be the case that $D1<D3\leq D1+D2$.

A portion of the tunneling thin film may be formed over at least a portion of an upper surface of the first electrode; and a protective layer may be formed on the portion of the tunneling thin film.

The mask pattern may be formed to cover a region or more of the second superconducting electrode in a horizontal direction across the trench, and the protective pattern may be formed together with the second superconducting electrode.

The trench of the substrate may have a first sidewall and a second sidewall facing each other, a first junction where the second superconducting electrode meets the tunneling thin film on the first sidewall may have a first area, a second junction where the second superconducting electrode meets the tunneling thin film on the second sidewall may have a second area, and the first area may be different from the second area.

A horizontal width of the first junction may be different than a horizontal width of the second junction, so that the first area of the first junction is different from the second area of the second junction.

A difference in the first area and the second area is equal to or greater than about 5 times.

The difference in the first area and the second area is equal to or greater than about 10 times.

The first area may be sufficiently less than the second area to enable the first junction to function as a main junction and to enable the second junction to function as a sub junction.

A conductive layer may be formed by doping a part of the substrate on the side of the second sidewall so as to reinforce concentration of a load on the main junction.

The first superconducting electrode or the second superconducting electrode may have a thickness no more than 200 nm.

The first superconducting electrode or the second superconducting electrode may include titanium nitride, niobium, niobium nitride, or titanium niobium nitride.

The tunneling thin film may include a metal, a semiconductor, or an insulator.

The tunneling thin film may include aluminum oxide (AlO), hafnium oxide (HfO), silicon nitride (SiN), or aluminum nitride (AlN).

In one general aspect, a Josephson junction includes a planar substrate having a first superconducting electrode layered thereon and having a linear groove through the planar substrate and the first superconducting electrode, the linear groove having a left wall included of a left portion of the planar substrate and a left portion of the first superconducting electrode, the linear groove also having a right wall included of a right portion of the planar substrate and a right portion of the first superconducting electrode; a tunneling film including a left portion lining the left wall of the linear groove and including a right portion lining the right wall of the linear groove; a second superconducting electrode in the linear groove having a left end with a first contact area with the left portion of the tunneling film and having a right end with a second contact area with the right portion of the tunneling film, the second contact area larger than the first contact area.

The tunneling film further may include a bottom portion lining a surface of the planar substrate that forms a bottom of the linear groove, and a bottom of the second superconducting electrode may contact the bottom portion of the tunneling film.

The second superconducting electrode may have an upper surface above the interface between the planar substrate and the first superconducting electrode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
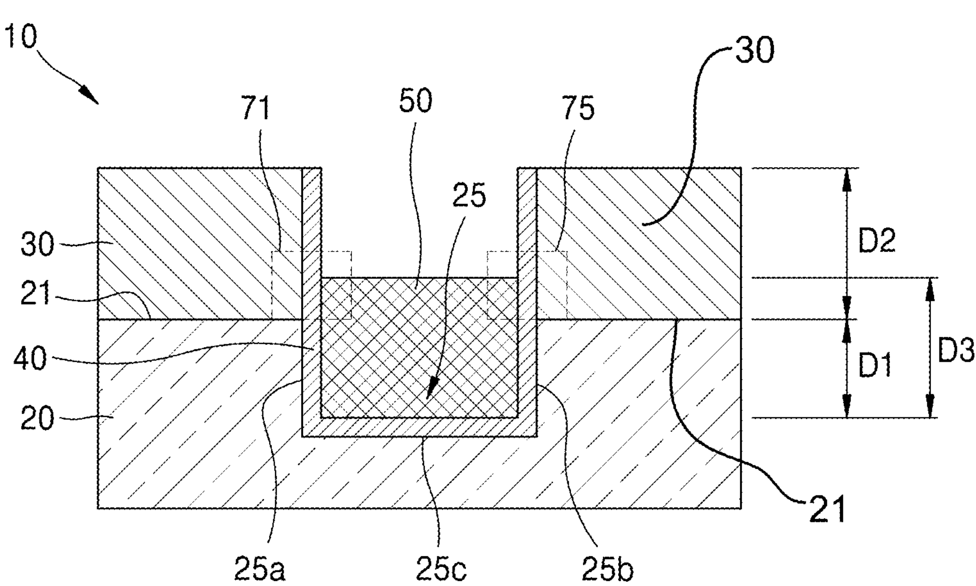
FIG. 1 is a cross-sectional view schematically showing a Josephson junction device according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only and is not to be used to limit the disclosure. The articles "a," "an," and "the" are intended to include the plural forms as well, unless the context clearly indicates otherwise. As used herein, the term "and/or" includes any one and any combination of any two or more of the associated listed items. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof.

Throughout the specification, when a component or element is described as being "connected to," "coupled to," or "joined to" another component or element, it may be directly "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment, e.g., as to what an example or embodiment may include or implement, means that at least one example or embodiment exists where such a feature is included or implemented, while all examples are not limited thereto.

The Josephson junction device and a superconducting thin film resonator may constitute a superconducting qubit. A fabrication yield of the superconducting qubit may be affected by formation of an oxide layer in a process of fabricating a tunneling layer of the Josephson junction device. For example, the Josephson junction device has a tunneling layer between a superconducting electrode and another superconducting electrode. When the tunneling layer is formed by oxidizing the superconducting electrodes, the oxide layer does not guarantee chemical stability. To overcome this, a scheme of adjusting the chemical stability of the oxide layer to some extent by utilizing post-processing may be used, however, a process error range for addressing multiple qubit frequencies may be limited when scalable qubits are fabricated.

Figure 2:
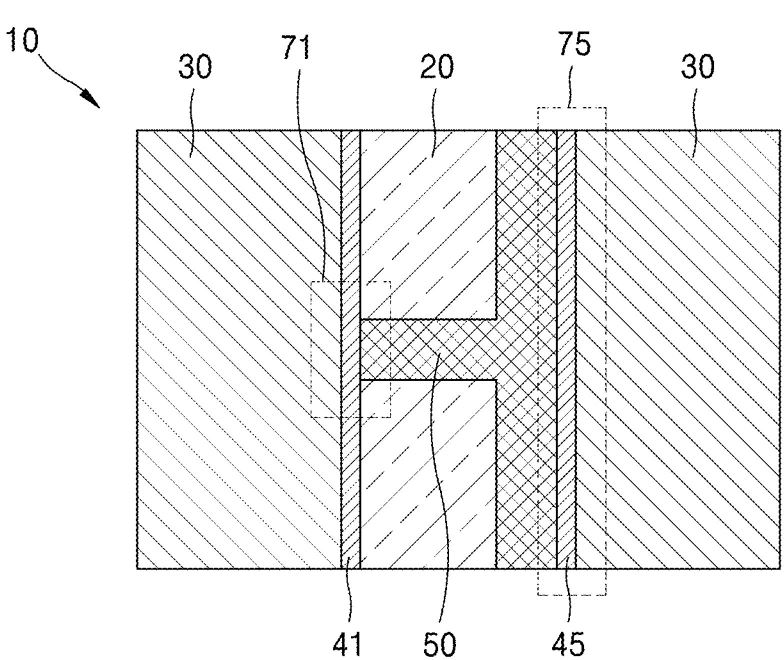
FIG. 2 is an overhead view schematically showing the Josephson junction device of FIG. 1 according to an embodiment.

FIG. 1 is a cross-sectional view of a Josephson junction device 10 according to an embodiment. FIG. 2 is a plan view of the Josephson junction device 10 according to an embodiment.

Referring to FIGS. 1 and 2, the Josephson junction device 10 according to an embodiment includes a substrate 20, a first superconducting electrode 30, a second superconducting electrode 50, a tunneling thin film 40 forming tunneling between the first superconducting electrode 30 and the second superconducting electrodes 50.

The substrate 20 has a first surface 21. The first surface 21 may correspond to an upper surface of the substrate 20. A trench 25 is formed as a recess (or linear channel or groove) in the substrate 20 with respect to the first surface 21 and having both ends open. The trench 25 has a bottom surface **25*c* corresponding to an etched surface of the substrate 20 and first and second sidewalls 25*a* and 25*b* spaced apart and facing each other. The substrate 20 may be a silicon substrate 20, but embodiments are not limited thereto. The substrate 20 may be any of various materials capable of implementing the Josephson junction device 10** through a semiconductor manufacturing process.

The first superconducting electrode 30 may be formed on the first surface 21 of the substrate 20 and may be adjacent to the trench 25, for example, to be adjacent to the first sidewall **25*a* and the second sidewall 25*b* of the trench 25**.

The tunneling thin film 40 is for forming tunneling between the first superconducting electrode 30 and the second superconducting electrode 50. The tunneling thin film 40 may be formed over the first and second sidewalls **25*a* and 25*b* of the trench 25 of the substrate 20 and over side surfaces of the first superconducting electrode 30 that face the trench 25. In some embodiments, the tunneling thin film 40 may extend to a part of the upper surface of the first superconducting electrode 30. The tunneling thin film 40 may be formed, for example, to a vertical extent above the upper surface of the second superconducting electrode 50. The tunneling thin film 40 may also be formed on the bottom surface 25*c* of the trench 25 of the substrate 20, but embodiments are not limited thereto. The tunneling thin film 40 may be formed to a thickness of, for example, several nm. The tunneling thin film 40** may be formed as a thin film having a thickness of about 2 nm or more, for example, a thickness of about 3 nm to about 4 nm or more.

The second superconducting electrode 50 may be formed to be in contact with the tunneling thin film 40 in the trench

25 in which the tunneling thin film 40 is formed, and may be formed to a height above the first surface 21 of the substrate 20. Accordingly, the side surfaces of the first superconducting electrode 30 and the second superconducting electrode 50 are in contact with the tunneling thin film 40, and a tunneling effect may be formed between the first superconducting electrode 30 and the second superconducting electrode 50 through the tunneling thin film 40.

The first superconducting electrode 30 and the second superconducting electrode 50 may be formed from the same superconducting material or different superconducting materials. The first superconducting electrode 30 and the second superconducting electrode 50 may be made of a superconducting material having a higher superconductivity than that of aluminum. The first superconducting electrode 30 and/or the second superconducting electrode 50 may include, for example, titanium nitride (TiN), but embodiments are not limited thereto. The first superconducting electrode 30 and/or the second superconducting electrode 50 may be formed to have a thin vertical thickness that ensures superconductivity, for example, a vertical thickness equal to or less than about 200 nm. For example, at least one of the first superconducting electrode 30 and the second superconducting electrode 50 may be formed by depositing a titanium nitride thin film to a thickness equal to or less than about 200 nm. As another example, either the first or the second superconducting electrode 30, 50 may include titanium nitride, and the other may include a different superconducting material. Besides, the first superconducting electrode 30 and the second superconducting electrode 50 may include various superconducting materials capable of forming a superconducting thin film. For example, the first superconducting electrode 30 and/or the second superconducting electrode 50 may include titanium nitride (TiN), niobium (Nb), niobium nitride (NbN), titanium niobium nitride (NbTiN), etc.

On the other hand, when the first superconducting electrode 30 and the second superconducting electrode 50 are made of, for example, titanium nitride, because titanium nitride has a higher superconductivity critical temperature than aluminum, titanium nitride may have higher superconductivity with respect to the same area, and, under the same or similar superconducting condition, a tunnel area may be further increased, or a thick tunneling thin film may be used. Because aluminum has a superconducting critical temperature of about 1K, whereas titanium nitride has a superconducting critical temperature of about 4K, titanium nitride exhibits higher superconductivity than aluminum for the same area of material.

Therefore, when the first superconducting electrode 30 and the second superconducting electrode 50 are made of, for example, titanium nitride, the tunnel area may be increased or the tunneling thin film may be thickened, and thus, the sensitivity of process error of the tunneling thin film 40 may be lowered, thereby improving the yield. For example, for some Josephson junction device 10 embodiments, the tunneling thin film 40 may be formed to a thickness equal to or greater than about 2 nm, for example, a thickness equal to or greater than about 3 nm and up to about 4 nm, and thus, the sensitivity of process (production) error of the tunneling thin film 40 may be improved, for example, by about 4 times or more. That is, tunneling film 40 may be less prone to fabrication/process defects (e.g. non-uniform film thickness), which may be beneficial because crosstalk is mostly caused by a small inter-frequency interval during fabrication of multiple qubits. When the first superconducting electrode 30 and the second superconducting electrode 50 are made of, for example, titanium nitride, the sensitivity of the process error of the tunneling thin film 40 may be improved, and thus, the crosstalk may be improved during fabrication of multiple qubits.

According to some embodiments of the Josephson junction device 10, the tunneling thin film 40 may include a metal, a semiconductor, and/or an insulator. For example, the tunneling thin film 40 may include aluminum oxide (AlO), silicon nitride (SiN), silicon oxide (SiO), hafnium oxide (HfO), etc. As described above, by forming the tunneling thin film 40 with a material separate from the first superconducting electrode 30 and/or separate from the second superconducting electrode 50, a process thickness of the tunneling thin film 40 may be readily controlled within a desired range. As a comparative example, when a tunneling thin film is formed by oxidizing a partial layer (a surface portion) of a superconducting electrode, because it is difficult to control the thickness of an oxidation layer, it is difficult to control production thickness of the tunneling thin film.

In addition, the tunneling thin film 40 may be formed to extend vertically from the sidewalls of the trench 25 to at least the height above the upper surface of the second superconducting electrode 50 on the side surface of the first superconducting electrode 30. That is, the tunneling thin film 40 may be formed to contact not only the first sidewall 25*a* and the second sidewall 25*b* of the trench 25, but also the side surface of the first superconducting electrode 30 and/or a part of an upper surface thereof corresponding to a height higher than the upper surface of the second superconducting electrode 50. Accordingly, a quantum tunneling feature may be formed between the first superconducting electrode 30 and the second superconducting electrode 50 through the tunneling thin film 40 being arranged within a range from the position of the first surface 21 of the substrate 20 to the upper surface of the second superconducting electrode 50, and a region in which tunneling occurs may be at a place where the first superconducting electrode 30 and the second superconducting electrode 50 face each other across the vertical portion of the tunneling thin film 40. Here, the tunneling thin film 40 may also be formed on the bottom surface 25*c* of the trench 25, but embodiment are not limited thereto. In FIGS. 1 and 2, and the following embodiments, the tunneling thin film 40 is also formed on the bottom surface 25*c* of the trench 25, but the tunneling thin film 40 may, selectively, not be formed on the bottom surface 25*c* of the trench 25 (i.e., is optional).

For example, referring to FIG. 1, when a depth of the trench 25 from the first surface 21 of the substrate 20 to the bottom surface of the second superconducting electrode 50 is D1, a distance from the first surface 21 to the upper surface of the first superconducting electrode 30, that is, a thickness of the first superconducting electrode 30 is D2, and a (vertical/depth) thickness of the second superconducting electrode 50 is D3, the second superconducting electrode 50 may be formed with a vertical thickness (height) satisfying the condition of $D1<D3\leq D1+D2$ so as to protrude above the first surface 21. When the condition of $D1<D3\leq D1+D2$ is satisfied, the second superconducting electrode 50 may protrude with respect to the first surface 21, and may be formed to a height which is the same as or lower than the upper surface of the first superconducting electrode 30. The second superconducting electrode 50 may be formed to protrude to a position (or elevation) higher than the upper surface of the first superconducting electrode 30. When the tunneling thin film 40 is formed over the first sidewall 25*a* and the second sidewall 25*b* of the trench 25 to the side surface of the first superconducting electrode 30 to include a region from the position of the first surface 21 to the position of the upper surface of the second superconducting electrode 50 (in FIG. 1, the segment D3 less the segment D1), a region in which tunneling is performed may correspond to a region extending from the first surface 21 where the first superconducting electrode 30 starts to the upper surface of the second superconducting electrode 50. That is, the region in which tunneling is performed may correspond to the thickness of D3-D1 and may vary depending on the thickness of the second superconducting electrode 50.

Here, the depth D1 of the trench 25 is the same as (or possibly more than) the vertical thickness of the second superconducting electrode 50 located in the trench 25, and the depth D1 may be different from the depth of an etched trench. As shown in FIGS. 1 and 2, when the tunneling thin film 40 is located on the bottom surface 25*c* of the trench 25, the depth D1 of the trench 25 may be obtained by subtracting the vertical thickness of the tunneling thin film 40 from the depth of the etched trench. When the tunneling thin film 40 is not formed on the bottom surface 25*c* of the trench 25, the depth D1 of the trench 25 may correspond to the depth of the etched trench.

On the other hand, referring to FIG. 2, the overhead (top-down) view of FIG. 1, the second superconducting electrode 50 may be provided such that (i) a first junction 71 (also shown in FIG. 1) formed between the first superconducting electrode 30 and the second superconducting electrode 50 through the tunneling thin film 40 on the first sidewall 25*a* of the trench 25 and (ii) a second junction 75 (also shown in FIG. 2) formed between the first superconducting electrode 30 and the second superconducting electrode 50 through the tunneling thin film 40 on the second sidewall 25*b* of the trench 25 are different from each other in in terms of the sizes of the junction areas. In FIG. 2 and in the following drawings, tunneling thin film 41 is the portion of tunneling thin film 40 (FIG. 1) formed on the first sidewall 25*a* of the trench 25 to form the first junction 71, and tunneling thin film 45 is the portion of tunneling thin film 40 (FIG. 1) formed on the second sidewall 25*b* of the trench 25 to form the second junction 75.

The first junction 71 has a first junction area (a surface area) where the second superconducting electrode 50 meets the thin tunneling film 41. Similarly, the second junction 75 has a second junction area where the second superconducting electrode 50 meets the thin tunneling film 45. The second junction area may be at least 5 times or more that of the first junction area. For example, the second junction area may be at least 10 times or more that of the first junction area. Because the length of the region in which tunneling of the tunneling thin film 40 occurs (i.e. the lengthwise portions of tunneling thin film 40 forming the first and second junctions 71, 75) corresponds to the thickness of D3-D1, the first junction area (of the first junction 71) and the second junction area (of the second junction 75) may be proportional to the width of the second superconducting electrode 50 in contact with the tunneling thin film 40. Therefore, the second superconducting electrode 50 may be formed such that the width of the second superconducting electrode 50 in contact with the tunneling thin film 41 on the first sidewall 25*a*) and the width of the second superconducting electrode 50 in contact with the tunneling thin film 45 on the second sidewall 25*b*) are different from each other, and thus, the junction areas of the first junction 71 and the second junction 75 may be different from each other.

For example, as shown in FIG. 2, a part of the second superconducting electrode 50 in contact with the tunneling thin film 41 on the first sidewall 25*a* may be formed to have a small width, and a part of the second superconducting electrode 50 in contact with the tunneling thin film 45 on the second sidewall 25*b* may be formed to have a wider width so that the first junction area of the first junction 71 is less than the second junction area of the second junction 75. This may be accomplished, for example, with the "T" shape (from above) of the second superconducting electrode 50; although the height (thickness from above) of the areas of contact are the same in the vertical direction, they differ in the horizontal direction (from above as shown in FIG. 2, the first junction 71 is shorter than the second junction 75). Although the "T" shape is convenient for manufacturing, other geometries that provide suitable tunneling may be used.

As described above, because the first and second junction areas of the first junction 71 and the second junction 75, respectively, are different from each other, the first junction 71 having a relatively small junction area may function as a main junction on which impedance is concentrated, and the second junction 75 having a relatively larger junction area may have a large conduction value to therefore function as a sub junction.

When (i) the wide width part of the second superconducting electrode 50 forming the second junction 75 is about 5 times or more or 10 times or more than the small width part of the second superconducting electrode 50 forming the first junction 71, and when (ii) the small width part of the second superconducting electrode 50 is formed so that the operating frequency of the first junction 71 (the main junction) is within the desired qubit frequency range, because the operating frequency of the second junction 75 (the sub junction) is out of the qubit frequency range, the Josephson junction device 10 provides a superconducting qubit operation through the first junction 71 that is the main junction. In this regard, when the second/sub junction 75 operates within the qubit frequency range, for example, the second junction 75 is maintained in a superconducting state or in another state, and does not affect the superconducting qubit operation.

As described above, when the sub junction is configured so that a sufficiently large conduction value is obtained by different areas of the main junction and the sub junction which are formed using the trench 25, the Josephson junction device 10 according to one or more embodiments may be configured so that the main impedance is concentrated on the main junction, and through this, a main qubit frequency may be determined as the design value of the main junction. Thus, the qubit frequency of the Josephson junction device 10 may be controlled according to the design of the junction areas of the main junction and the sub junction.

Figure 3A:
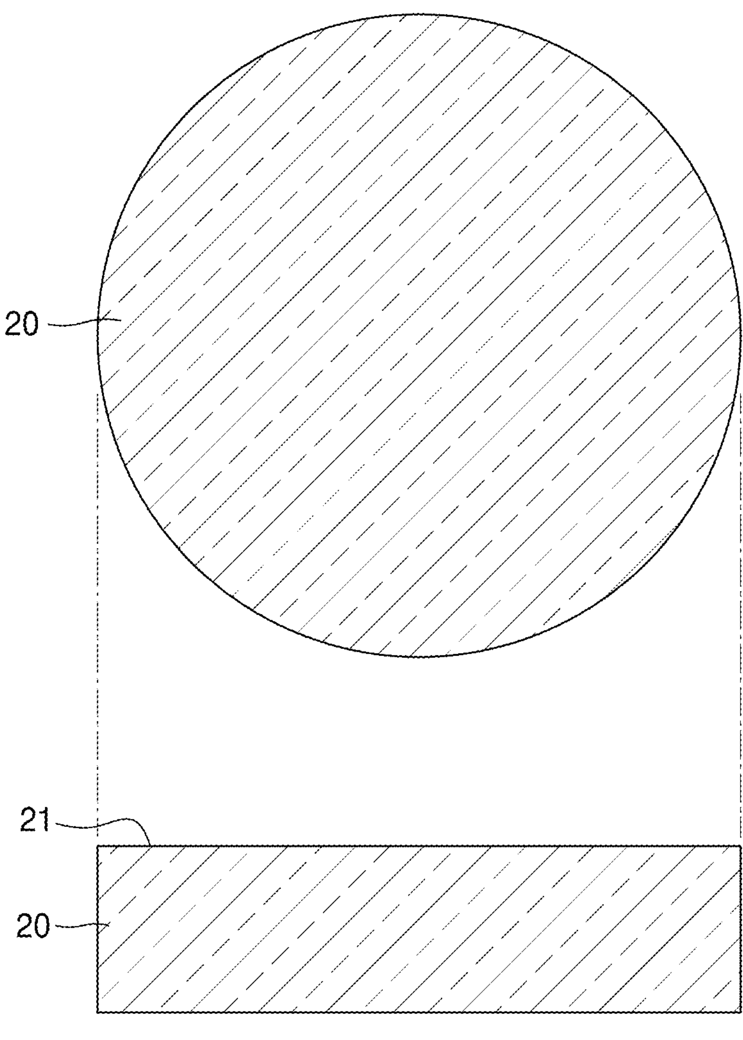
FIGS. 3A to 3K illustrate a process of manufacturing a Josephson junction device according to an embodiment.
Figure 3B:
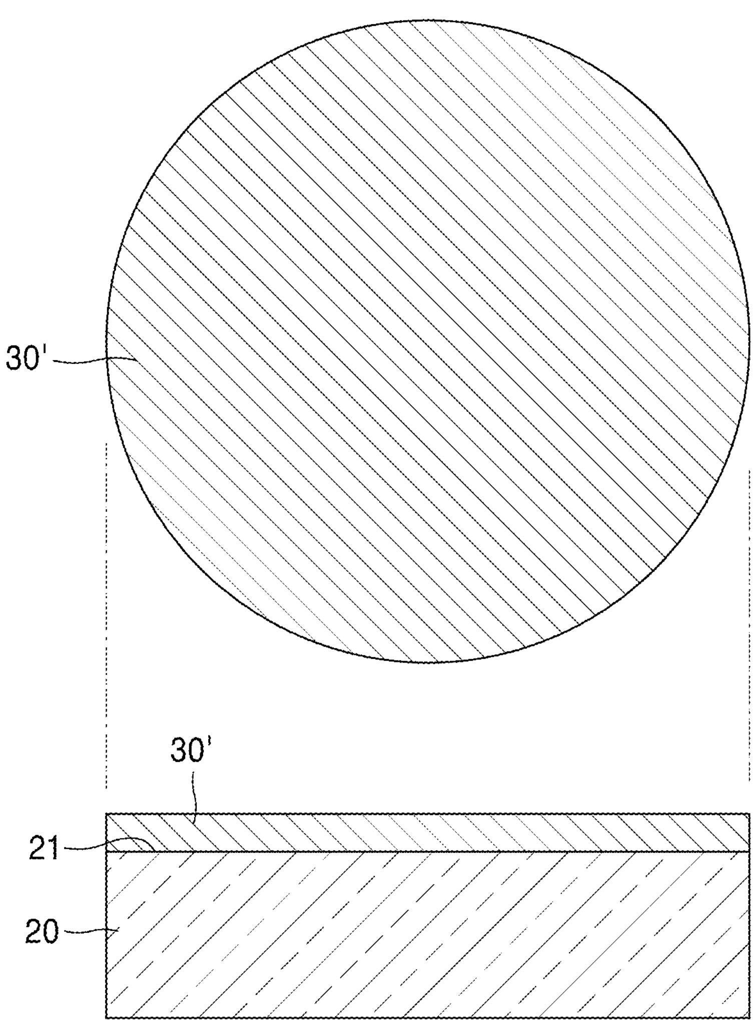
Figure 3C:
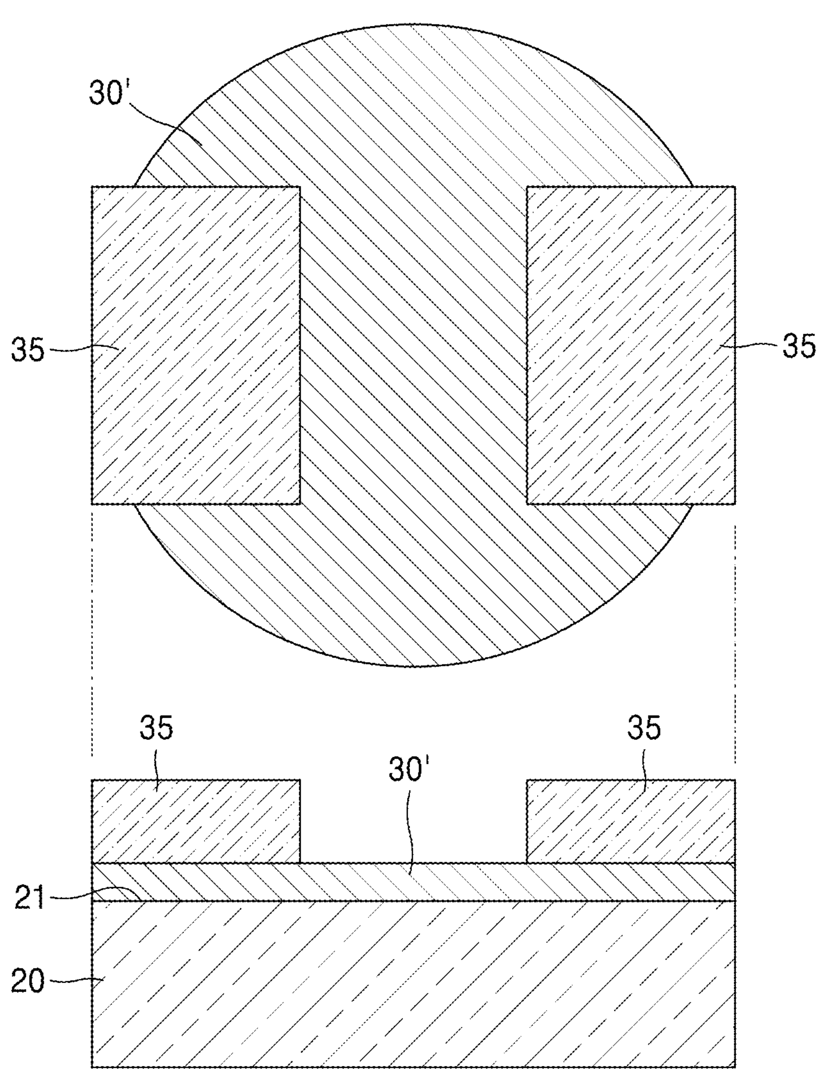
Figure 3D:
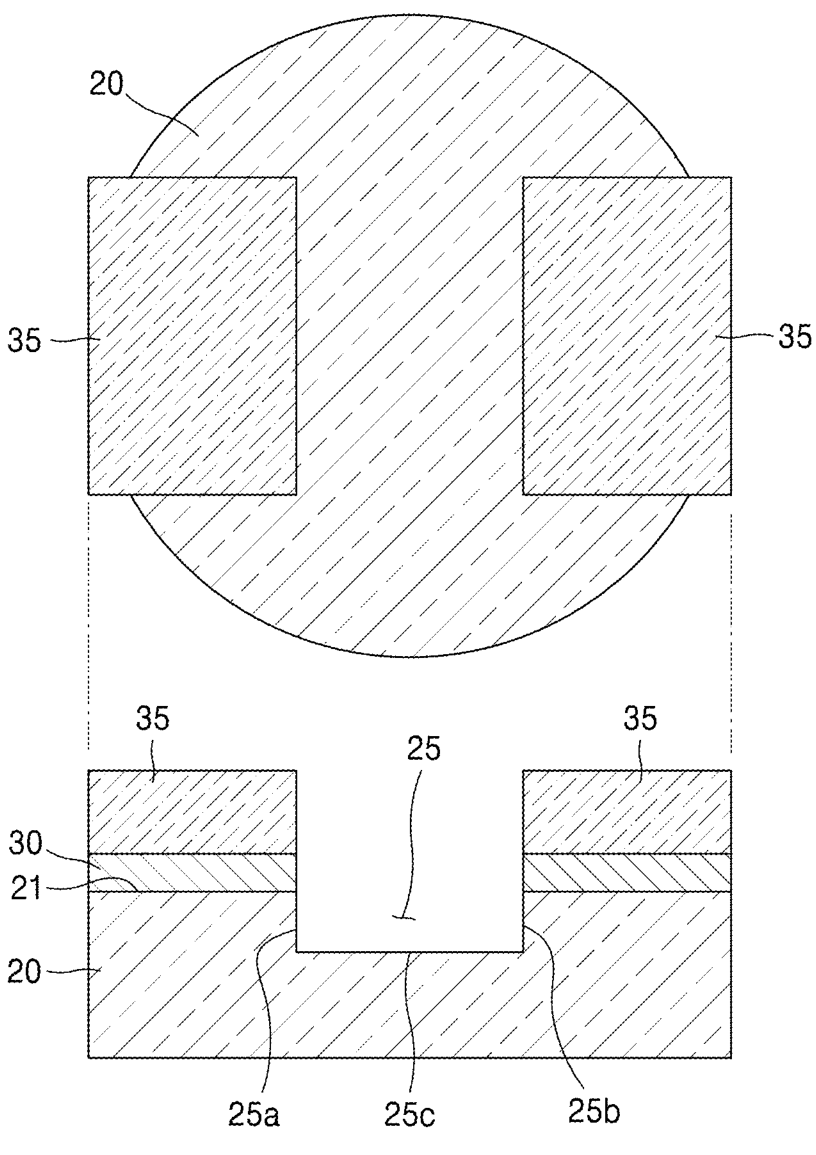
Figure 3E:
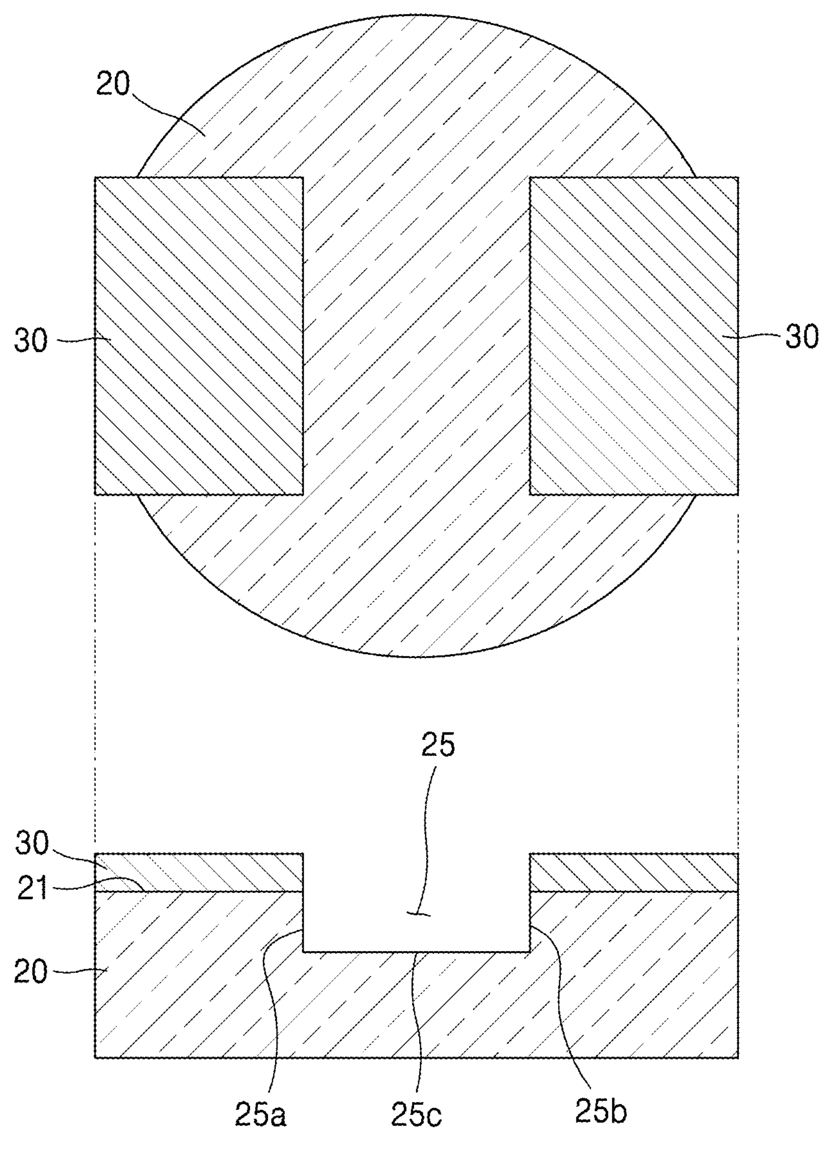
Figure 3F:
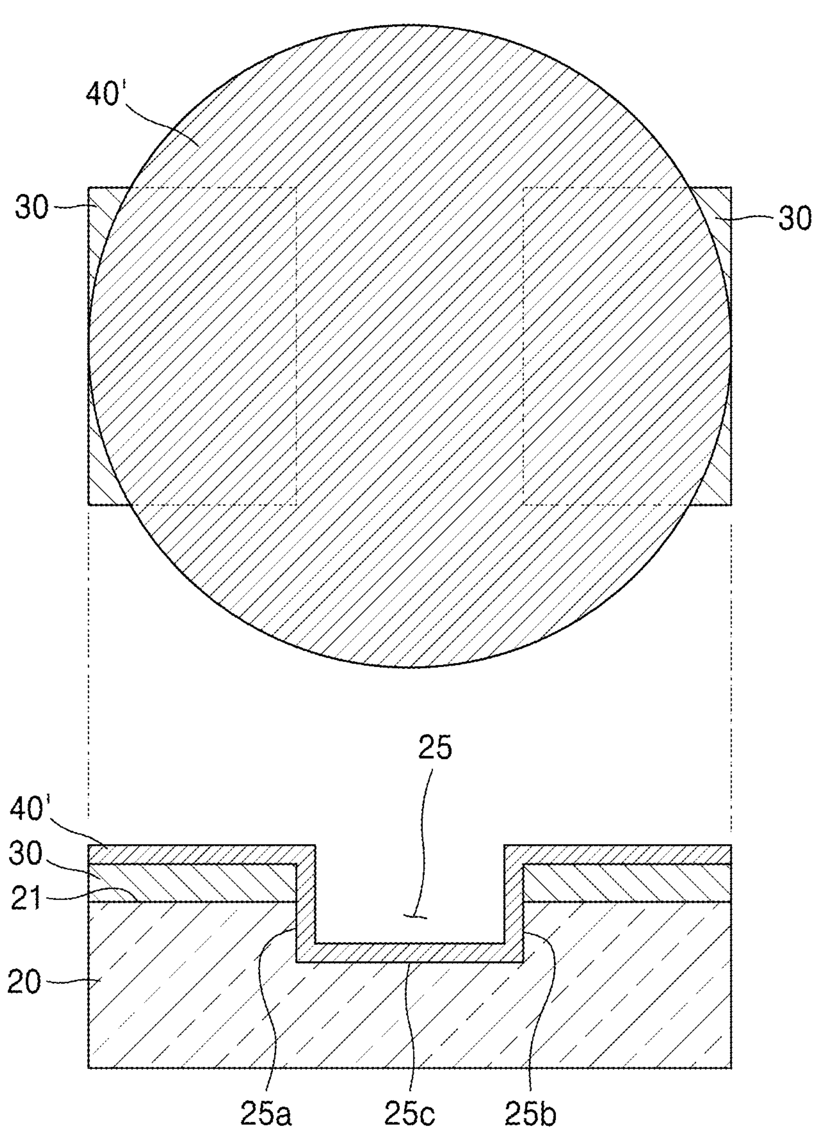
Figure 3G:
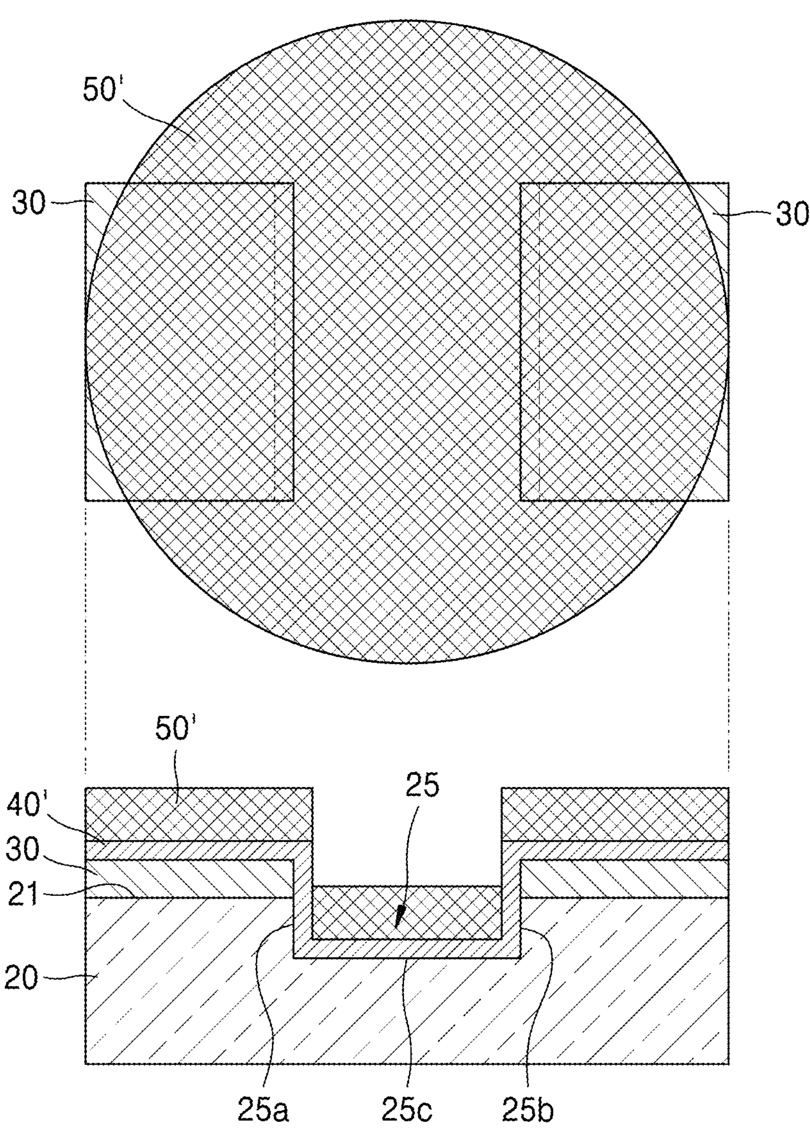
Figure 3H:
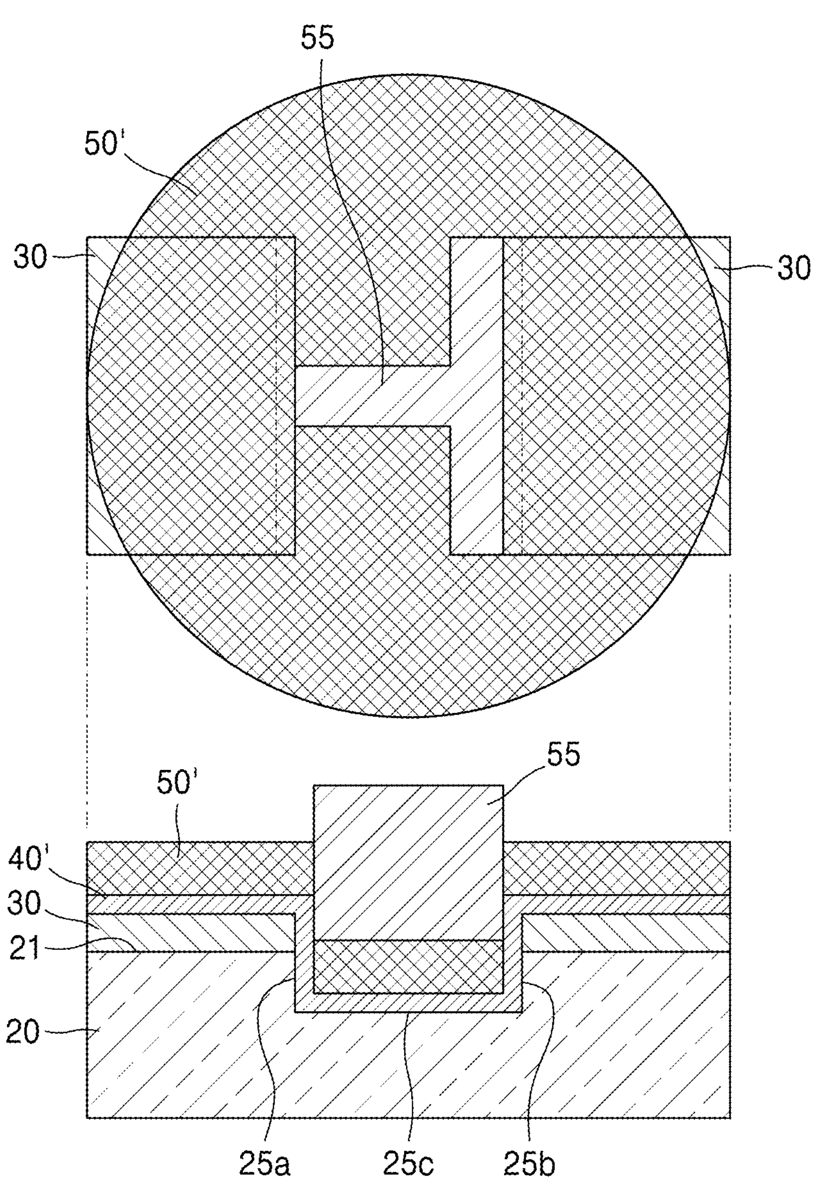
Figure 3I:
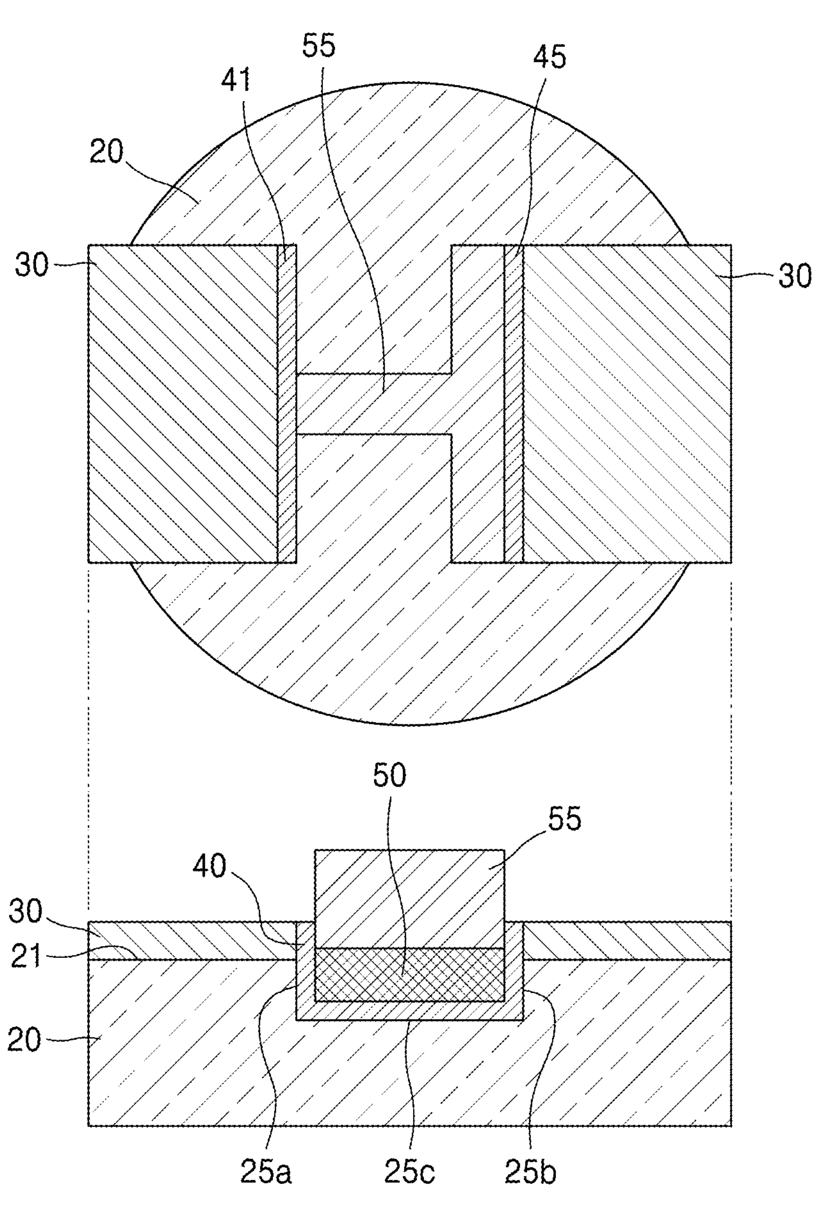
Figure 3J:
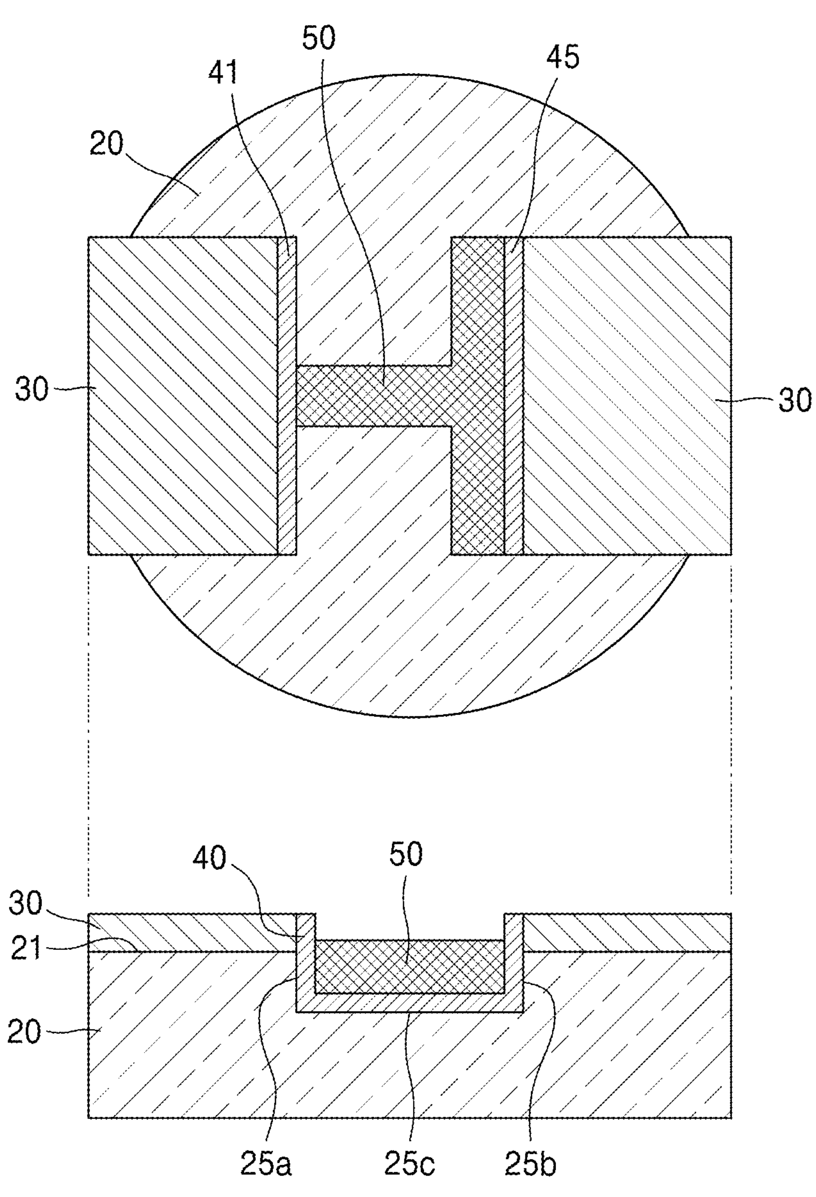
Figure 3K:
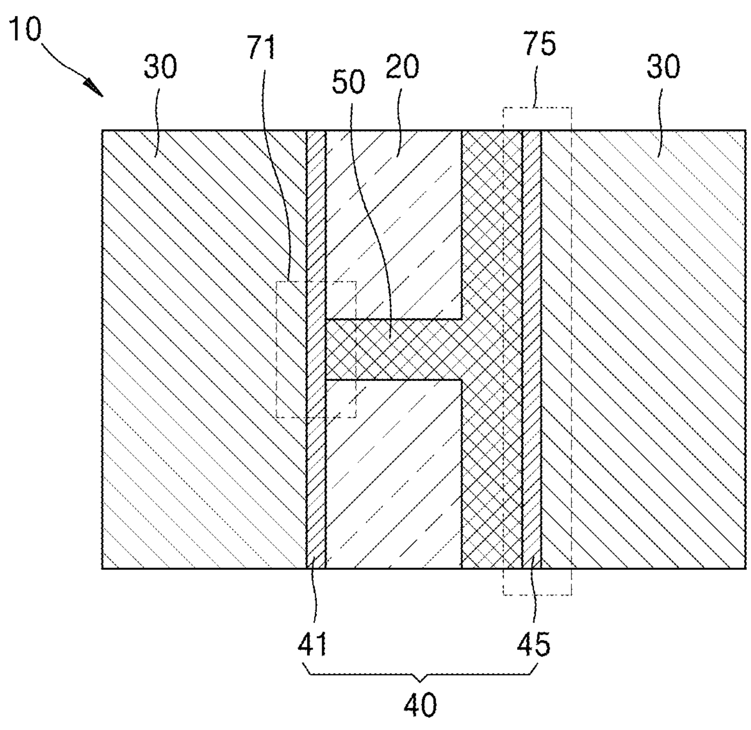
Figure 3K:
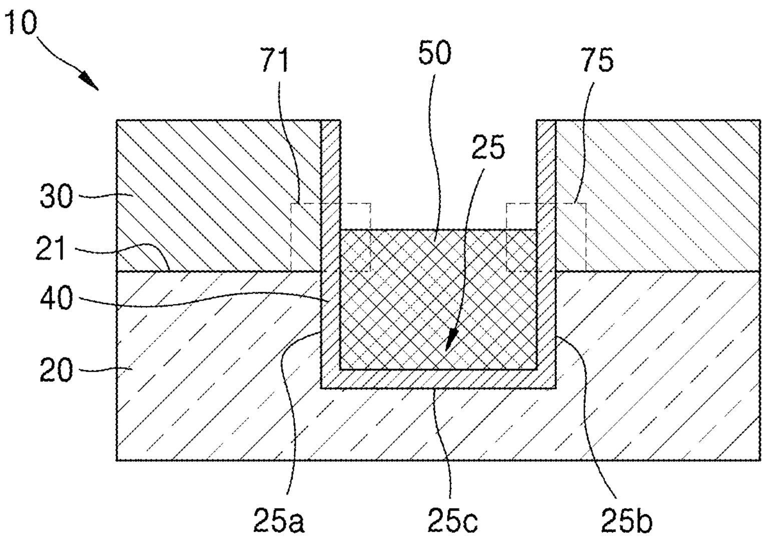

FIGS. 3A to 3K illustrate a process of manufacturing the Josephson junction device 10 according to one or more embodiments. The order of FIGS. 3A to 3K may, in some embodiments, correspond to an order of manufacturing steps. In each of FIGS. 3A to 3K, the top Figure portion is a top view (view from above), and the lower Figure portion is a corresponding cross-sectional view. Although the top Figure portions of FIGS. 3A to 3J show circularly shaped substrate 20 as applied to manufacturing the Josephson junction device 10, the illustrated circular shape does not represent the shape of the entire substrate 20, but rather indicates a partial region of the substrate 20, for example, as defined by other material such as electrode and/or thin film. In other words the circular shapes in FIGS. 3A to 3J represent a footprint on the substrate 20 rather than a defined structure of the substrate 20. FIG. 3K is an enlarged view of the manufactured Josephson junction device 10.

Referring to FIG. 3A, first, the substrate 20 having a first surface 21 is prepared. The substrate 20 may be a silicon substrate, but embodiment are not limited thereto. Substrates of various materials capable of manufacturing the Josephson junction device 10 through a semiconductor process may be used as the substrate 20.

Referring to FIG. 3B, a superconducting material layer 30' forming the first superconducting electrode 30 is deposited on the prepared substrate 20. The superconducting material layer 30' may be formed through a deposition process, for example, a sputtering process. The superconducting material layer 30' may be made of various superconducting materials. The superconducting material layer 30' may include, for example, titanium nitride (TiN), but embodiment are not limited thereto. To ensure superconductivity of the first superconducting electrode 30 to be formed, the superconducting material layer 30' may be formed, for example, to a thickness equal to or less than about 200 nm. For example, the superconducting material layer 30' may be formed by depositing a titanium nitride thin film to a thickness equal to or less than about 200 nm. The superconducting material layer 30' may be made of various superconducting materials capable of forming a superconducting thin film. For example, the superconducting material layer 30' may include at least one of titanium nitride (TiN), niobium (Nb), niobium nitride (NbN), or titanium niobium nitride (NbTiN).

Referring to FIGS. 3C and 3D, mask patterns 35 are applied. The mask patterns 35 have a distance between them that corresponds to the width (from above) of the trench 25 to be formed on the superconducting material layer 30'. The mask patterns 35 also cover respective regions where opposing portions of the first superconducting electrode 30 are to be formed (on both sides of a trench are formed). After the mask patterns 35 are applied, an etching process is performed. Accordingly, the exposed region of superconducting material layer 30' (i.e., the part not covered by the mask patterns 35) is removed (e.g., ablated) thus forming the first superconducting electrode 30 from the superconducting material layer 30'. With the covering of superconducting material layer 30' removed, the substrate 20 is exposed. Then, the exposed substrate 20 is etched in the region other than the mask patterns 35 (in the area of the trench 25 where the substrate 20 has been exposed) by an over-etching process, and thus, the trench 25 is recessed below the first surface 21 of the substrate 20 and formed with both ends open. The trench 25 has a structure defined by (i) the etched first and second sidewalls **25*a*, 25*b*, and (ii) the bottom surface 25*c* of the substrate 20 (and both ends of the trench 25 are open). Next, referring to FIG. 3E, the mask patterns 35** are removed.

Through the formation obtained by using the mask patterns 35 during the etching process, the superconducting material layer 30' is patterned, and the trench 25 with both ends open is recessed below the first surface 21 of the substrate 20, and thus, the first superconducting electrode 30 adjacent to the trench 25 and exposed on both sides of the trench 25.

Next, referring to FIGS. 3F and 3G, a tunneling thin film layer 40' is deposited to cover the first superconducting electrode 30 and the trench 25, and a superconducting material layer 50' is deposited on the tunneling thin film layer 40'. The superconducting material layer 50' is to form the second superconducting electrode 50, and may be formed in the trench 25 to a thickness reaching a height protruding above the first surface 21. The height of the superconducting material layer 50' protruding above the first surface 21 may be determined according to the junction areas (first and second surface areas) of the first junction 71 and the second junction 75 to be obtained in the Josephson junction device 10 according to one or more embodiments.

The tunneling thin film layer 40' may be formed over the bottom surface **25*c*, the first sidewall 25*a* and the second sidewall 25*b* of the trench 25, and the side and upper surfaces adjacent to the trench 25 of the first superconducting electrode 30. The tunneling thin film layer 40' may be formed to be in contact with the side surface of the first superconducting electrode 30. The superconducting material layer 50' may be deposited to be in contact with the tunneling thin film layer 40'. The superconducting material layer 50' may be formed in the trench 25 to be in contact with the tunneling thin film layer 40', and may also be formed on the tunneling thin film layer 40' of the upper surface of the first superconducting electrode 30. Here, when a device is manufactured to have a structure in which there is to be no tunneling thin film layer 40' on the bottom surface 25*c* of the trench 25, a process of removing the tunneling thin film layer 40' located on the bottom surface 25*c* of the trench 25 may be performed, and then, a process of depositing the superconducting material layer 50'** may be performed.

The tunneling thin film layer 40' may be made of a material and thickness capable of forming tunneling between the first superconducting electrode 30 and the second superconducting electrode 50 formed by the superconducting material layer 50'. The tunneling thin film layer 40' may include a metal, a semiconductor, and/or an insulator. For example, the tunneling thin film layer 40' may include any one of aluminum oxide (AlO), hafnium oxide (HfO), silicon nitride (SiN), and/or aluminum nitride (AlN), or may include another functionally suitable material. The tunneling thin film layer 40' may be formed to a thickness of, for example, several nm. The tunneling thin film layer 40' may be formed as a thin film having a thickness of about 2 nm or more, for example, a thickness of about 3 nm to 4 nm or more.

The superconducting material layer 50' may be formed through a deposition process, for example, a sputtering process. The superconducting material layer 50' may be made of various superconducting materials. The superconducting material layer 50' may include, for example, titanium nitride (TiN), but embodiments are not limited thereto. To ensure superconductivity of the second superconducting electrode 50, the superconducting material layer 50' may be formed, for example, to a thickness equal to or less than about 200 nm. For example, the superconducting material layer 50' may be formed by depositing a titanium nitride thin film to a thickness equal to or less than about 200 nm. Besides, the superconducting material layer 50' may be made of various superconducting materials capable of forming a superconducting thin film. For example, the superconducting material layer 50' may include titanium nitride (TiN), niobium (Nb), niobium nitride (NbN), and/or titanium niobium nitride (NbTiN). The superconducting material layer 50' may be made of the same material as, or a different material from, the first superconducting electrode 30.

Next, referring to FIGS. 3H and 3I, a mask pattern 55 is applied. The mask pattern 55 has a shape corresponding to the shape of the second superconducting electrode 50 that is to be formed. An etching process is then performed. As a result, the superconducting material layer 50' and the tunneling thin film layer 40' are removed in a region exposed by the mask pattern 55 so that the second superconducting electrode 50 and the tunneling thin film 40 are formed. The first superconducting electrode 30 may be exposed by the etching process. In FIGS. 3H and 31, the width (from left to right in the top/overhead portions of FIGS. 3H and 31) of the mask pattern 55 corresponds to a spacing between the tunneling thin film layer 40' formed over the first sidewall 25*a* and the second sidewall 25*b* of the trench 25 and the side surface of the first superconducting electrode 30, but the mask pattern 55 may have a width wider than the spacing, thereby preventing damage to the tunneling thin film 40 formed on the side surface of the first superconducting electrode 30 during the etching process.

Next, referring to FIGS. 3J and 3K, the Josephson junction device 10 may be obtained by removing the mask pattern 55.

The etching process as applied to the mask pattern 55 may form (i) the tunneling thin film 40 on the sidewalls of the trench 25 of the substrate 20 and on the side (trench-facing) surface of the first superconducting electrode 30 may be formed, and (ii) the second superconducting electrode 50 in contact with the tunneling thin film 40 on the first sidewall 25*a* and on the second sidewall 25*b* of the trench 25.

The mask pattern 55 may be formed to correspond to the desired shape of the second superconducting electrode 50, and thus, as shown in FIGS. 3J and 3K, the second superconducting electrode 50 may be formed such that the first junction 71 forming junction with the tunneling thin film 41 on the first sidewall 25*a* of the trench 25 and the second junction 75 forming junction with the tunneling thin film 45 on the second sidewall 25*b* are different from each other in terms of their respective junction area sizes.

Referring to FIG. 3K, because the region in which tunneling of the tunneling thin film 40 (which forms the first junction 71 and the second junction 75) is performed corresponds to approximately the thickness (of D3-D1 in FIG. 1) from the position of the first surface 21 to the height of the upper surface of the second superconducting electrode 50, the junction areas of the respective first and second junctions 71, 75 may be proportional to the width of the second superconducting electrode 50 in contact with the tunneling thin film 40.

Accordingly, for example, the mask pattern 55 as shown in FIG. 3H may be configured such that the first junction area of the first junction 71 is less than the second junction area of the second junction 75, and the etching process and a process of removing the mask pattern 55 may be performed as shown in FIGS. 3I and 3J, thereby forming, as shown in FIG. 3K, the Josephson junction device 10 in which a part of the second superconducting electrode 50 in contact with the tunneling thin film 41 on the first sidewall 25*a* has a small width, and a part of the second superconducting electrode 50 in contact with the tunneling thin film 45 on the second sidewall 25*b* has a wide width. As can be seen in the top half of FIG. 3K, the length of the box for the first junction 71 (the bottom end of the "T") is substantially smaller than the length of the box of the second junction 75 (the top of the "T").

In this regard, the second superconducting electrode 50 may be formed such the second junction area of the second junction 75 is equal to or more about 5 times or equal to or more 10 times than the first junction area of the first junction 71. That is, because the thickness (depth-wise) of the second superconducting electrode 50 is approximately constant, in order to obtain the difference in the junction area, the second superconducting electrode 50 may be formed to have (i) a small width where it contacts the tunneling thin film 41 at the first sidewall 25*a* of the trench 25, and (ii) a relatively wide range where it contacts the tunneling thin film 45 on the second sidewall 25*b* of the trench 25. In this regard, the second superconducting electrode 50 may be formed such that the wide width is equal to or more about 5 times or equal to or more about 10 times than the small width. Put another way, due to the relatively uniform depth/thickness of the second superconducting electrode 50, any necessary difference in conductance between the first and second junctions 71, 75 may be provided by varying dimension of the "T" shape of the second superconducting electrode 50.

For the Josephson junction devices 10 manufactured as described above, because the junction areas of the first junction 71 and the second junction 75 are different from each other in terms of size, as described above, the first junction 71 having a relatively small junction area may form a main junction where impedance is concentrated, and the second junction 75 having a relatively large junction area may have a large conduction value to form a sub junction.

Figure 4A:
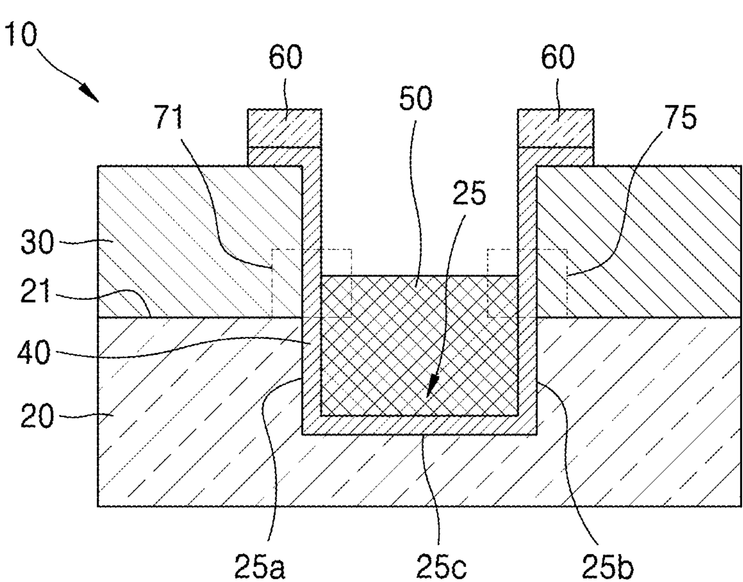
FIGS. 4A and 4B are cross-sectional and overhead views showing a modified example of a Josephson junction device according to an embodiment.
Figure 4B:
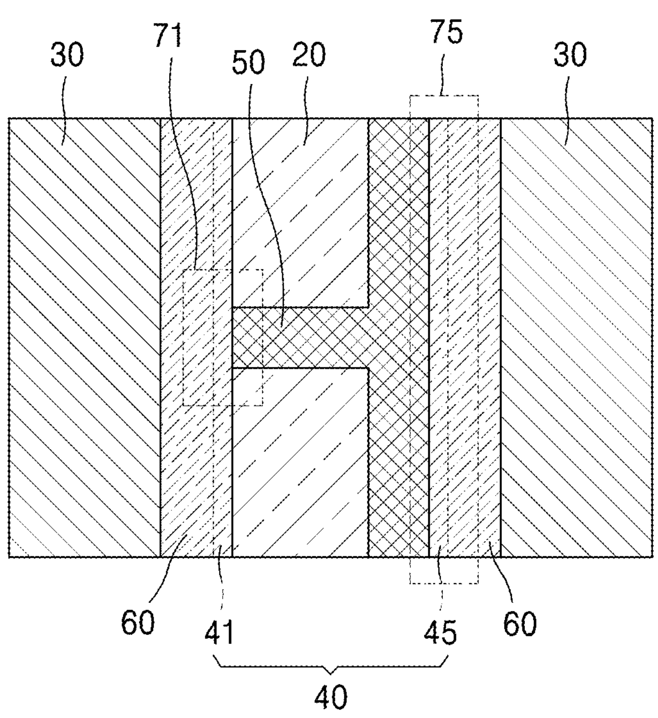

FIGS. 4A and 4B are cross-sectional and overhead views, respectively, showing a modified example of the Josephson junction device 10 according to one or more embodiments.

Embodiments shown in FIGS. 4A and 4B differ from embodiments shown in FIGS. 1 and 2 in that the Josephson junction device 10 shown in FIGS. 4A and 4B further includes a protective pattern 60 protecting the tunneling thin film 40 on the first superconducting electrode 30.

The protective pattern 60 may be formed, for example, together with the forming of the second superconducting electrode 50. For example, in a state where the mask pattern 55 patterning the tunneling thin film layer 40' and the superconducting material layer 50' as shown in FIG. 3H is applied to a region covering the protective pattern 60, when the etching process as shown in FIG. 3I is performed, the protective pattern 60 may be formed together with the tunneling thin film 40 and the second superconducting electrode 50. In this regard, the protective pattern 60 may be a portion left after the etching process of the superconducting material layer 50' to form the second superconducting electrode 50.

As another example, the protective pattern 60 may be a layer (and material) separate from the superconducting material layer 50' for the second superconducting electrode 50. For example, after depositing the tunneling thin film layer 40', the protective pattern 60 may be formed to cover a portion or more of the tunneling thin film layer 40' formed on the side surface of the first superconducting electrode 30, and the superconducting material layer 50' may be deposited. Then, while forming the tunneling thin film 40 and the second superconducting electrode 50, by forming the mask pattern 55 as shown in FIG. 3H and performing the etching process as shown in FIG. 3I, a structure including the protective pattern 60 on the tunneling thin film 40 at the side (trench-facing) surface of the first superconducting electrode 30 may be formed.

As described above, when the protective pattern 60 is provided, damage to the tunneling thin film 40 on the side surface of the first superconducting electrode 30 during the etching process may be reduced or prevented, thereby preventing/reducing damage to the junction formed between the first and second superconducting electrodes 30 and 50 and the tunneling thin film 40. Therefore, the junction area size may be increased, and accordingly, a conductance of a conduction channel through the junction may be increased.

FIGS. 4A and 4B illustrate an example of a structure in which the protective pattern 60 extends to the upper surface of the first superconducting electrode 30, but the embodiment is not limited thereto. For example, the protective pattern 60 may be formed only on a portion of the tunneling thin film 40 formed on the side surface of the first superconducting electrode 30 or a partial region including the portion. In addition, FIGS. 4A and 4B illustrate an example in which the protective pattern 60 has a thickness smaller than that of the second superconducting electrode 50, but the protective pattern 60 may have the same thickness as the second superconducting electrode 50 and may be a portion left during the etching process (of the superconducting material layer 50') that forms the second superconducting electrode 50. The protective pattern 60 may be a layer separate from the superconducting material layer 50' for forming the second superconducting electrode 50, and may have the same or different thickness (depth-wise) as that of the second superconducting electrode 50.

Figure 5:
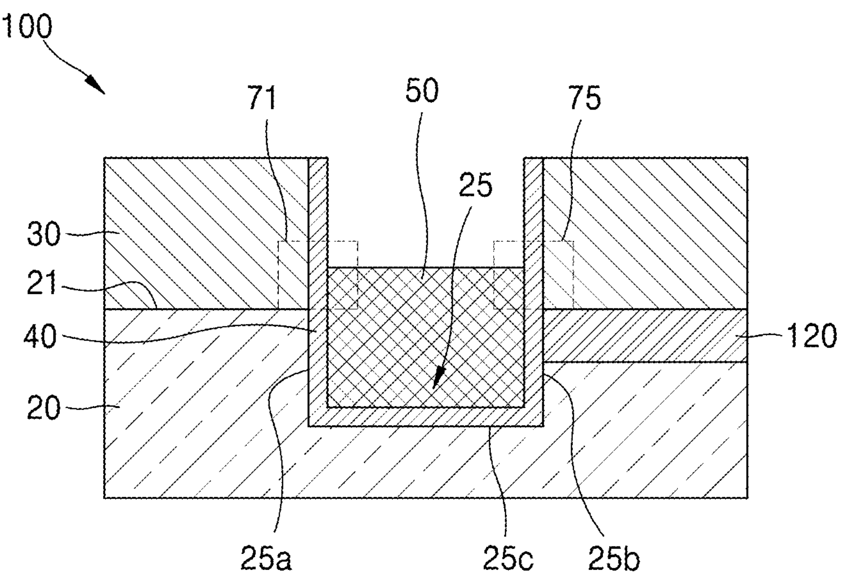
FIGS. 5 and 6 are cross-sectional and overhead views showing a Josephson junction device according to another embodiment.
Figure 6:
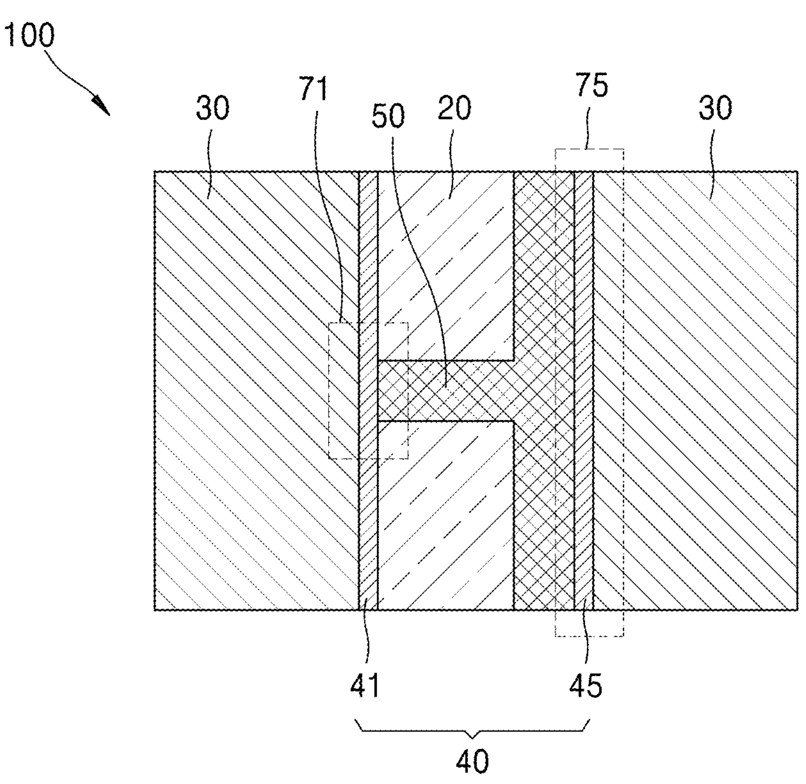

FIGS. 5 and 6 are cross-sectional and overhead views, respectively, showing the Josephson junction device 100 according to one or more embodiments.

Compared with FIGS. 1 and 2, as shown in FIGS. 5 and 6, the conductive layer 120 may be further formed on a side of the second junction 75 (the sub junction) so that the Josephson junction device 100 may reinforce concentration of the load on the first junction 71 (the main junction) on the side on which the conductive layer 120 is not formed.

Referring to FIGS. 5 and 6, the conductive layer 120 may be a region in which a partial region of the substrate 20 is doped by, for example, injecting a doping element 21 into a portion of the substrate 20 on a side of the first sidewall 25*a* through the first surface. As another example, the conductive layer 120 may be a layer formed after removing a partial thickness of the portion of the substrate 20 on the side of the first sidewall 25*a*. The conductive layer 120 may be provided to form an Ohmic contact with the tunneling thin film 40. A shape of the conductive layer 120 as viewed from above is described with reference to FIGS. 8A to 8K.

Figure 7:
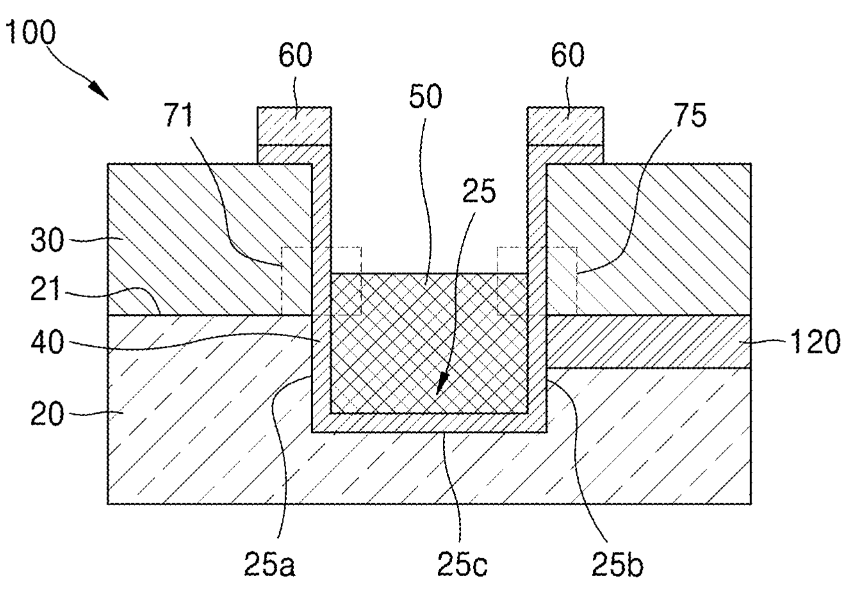
FIG. 7 is a cross-sectional view schematically showing a modified example of a Josephson junction device according to another embodiment.

FIG. 7 is a cross-sectional view schematically showing a modified example of a Josephson junction device 100 according to one or more embodiments. The Josephson junction device 100 shown in FIG. 7 differs from that shown in FIGS. 5 and 6 in that the Josephson junction device 100 in FIG. 7 further includes the protective pattern 60 protecting the tunneling thin film 40 on the first superconducting electrode 30. Formation of the protective pattern 60 and a protection function of the tunneling thin film 40 accordingly are the same as those described above with reference to FIGS. 4A and 4B.

Figure 8A:
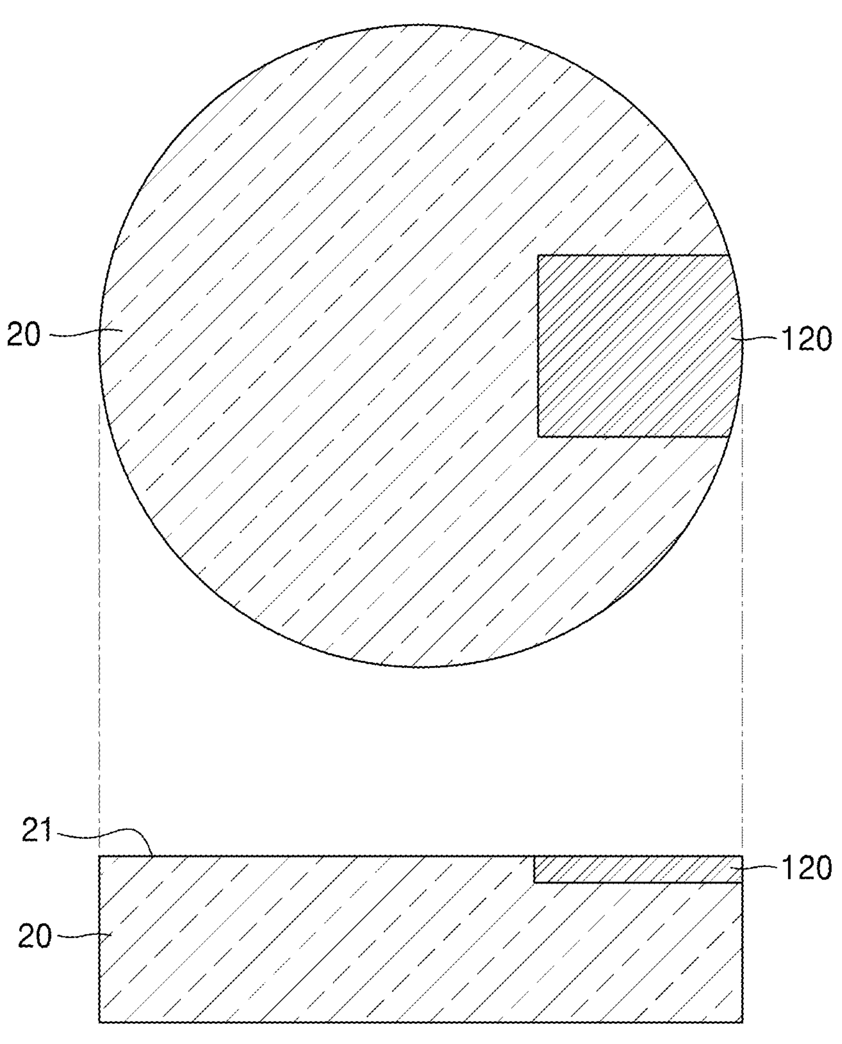
FIGS. 8A to 8K illustrate a process of manufacturing a Josephson junction device according to another embodiment.
Figure 8B:
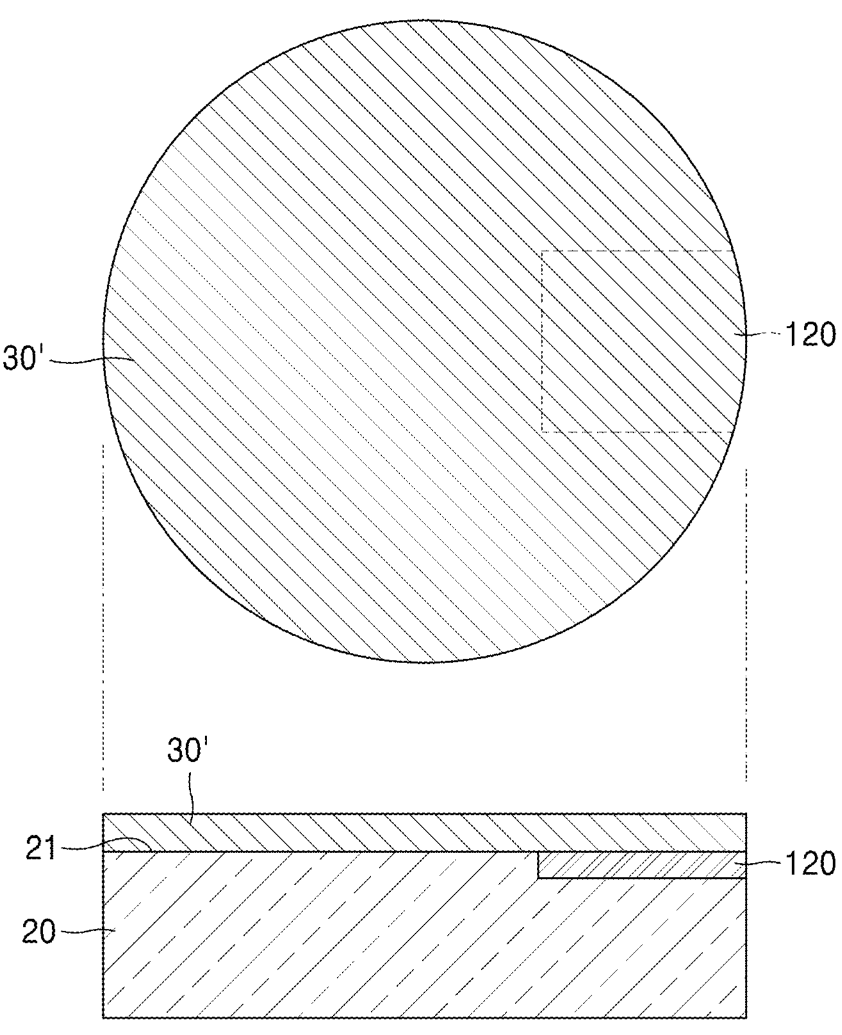
Figure 8C:
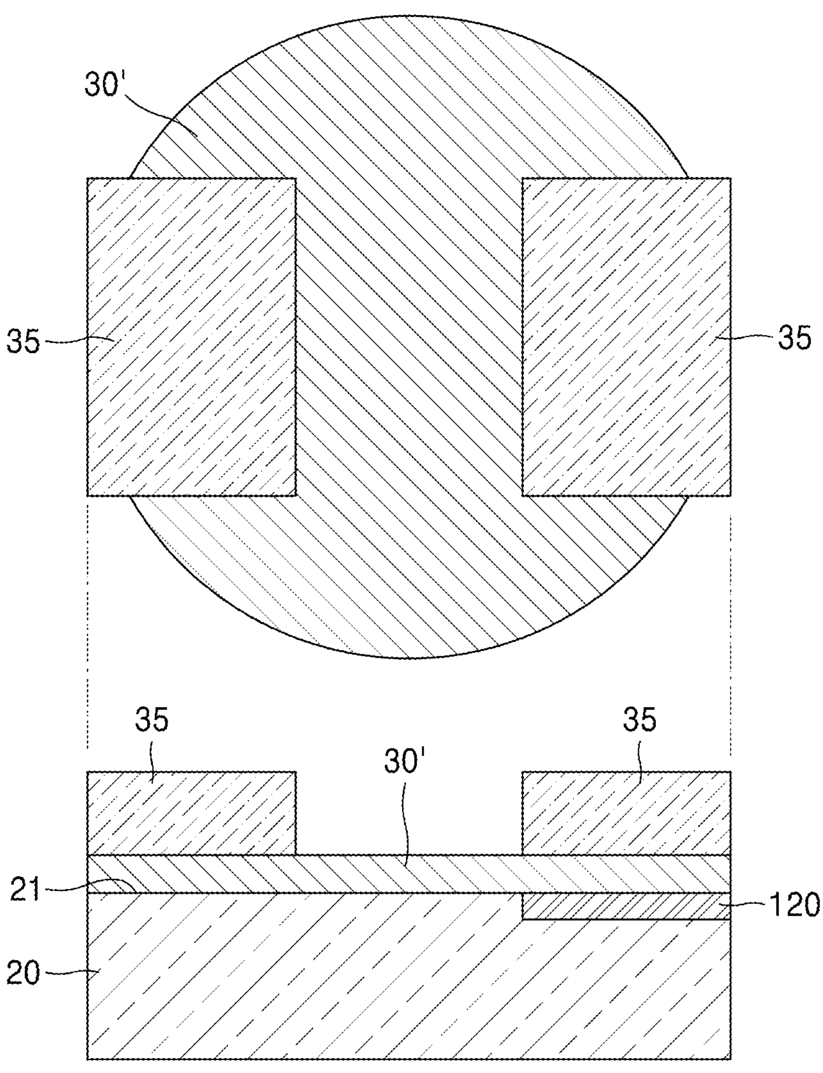
Figure 8D:
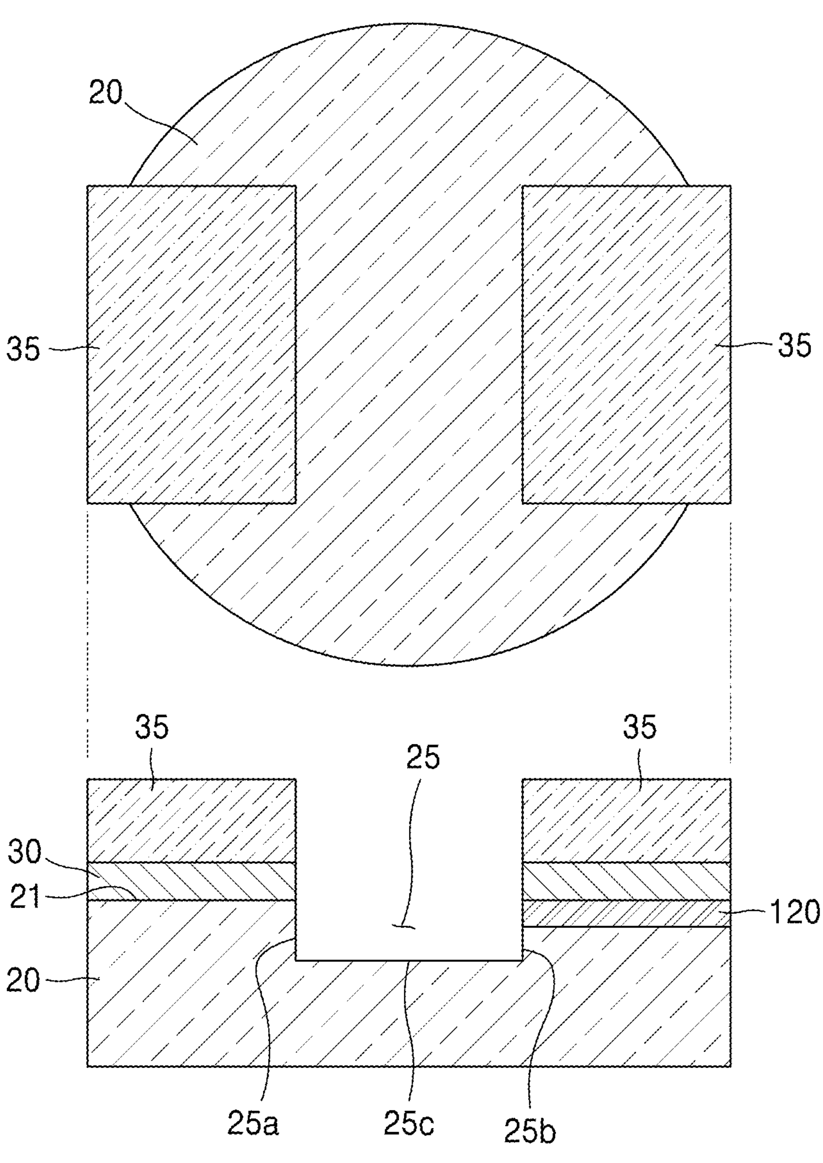
Figure 8E:
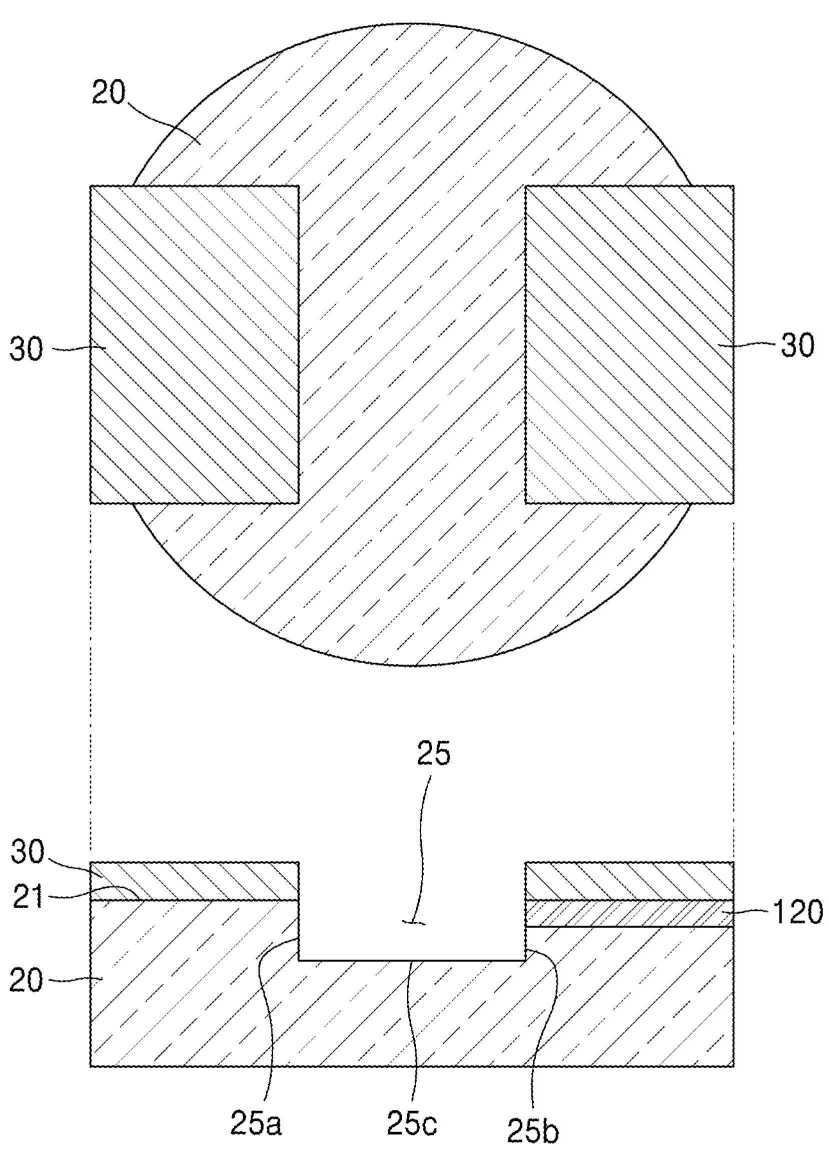
Figure 8F:
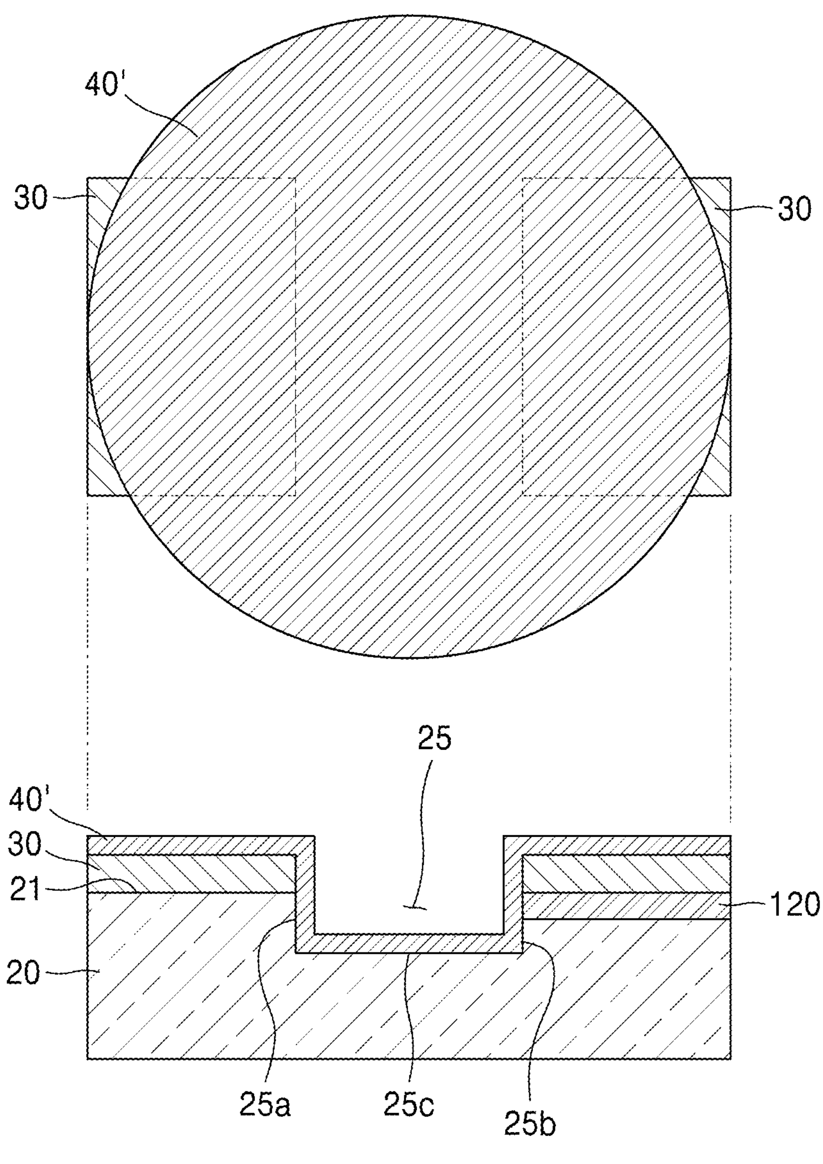
Figure 8G:
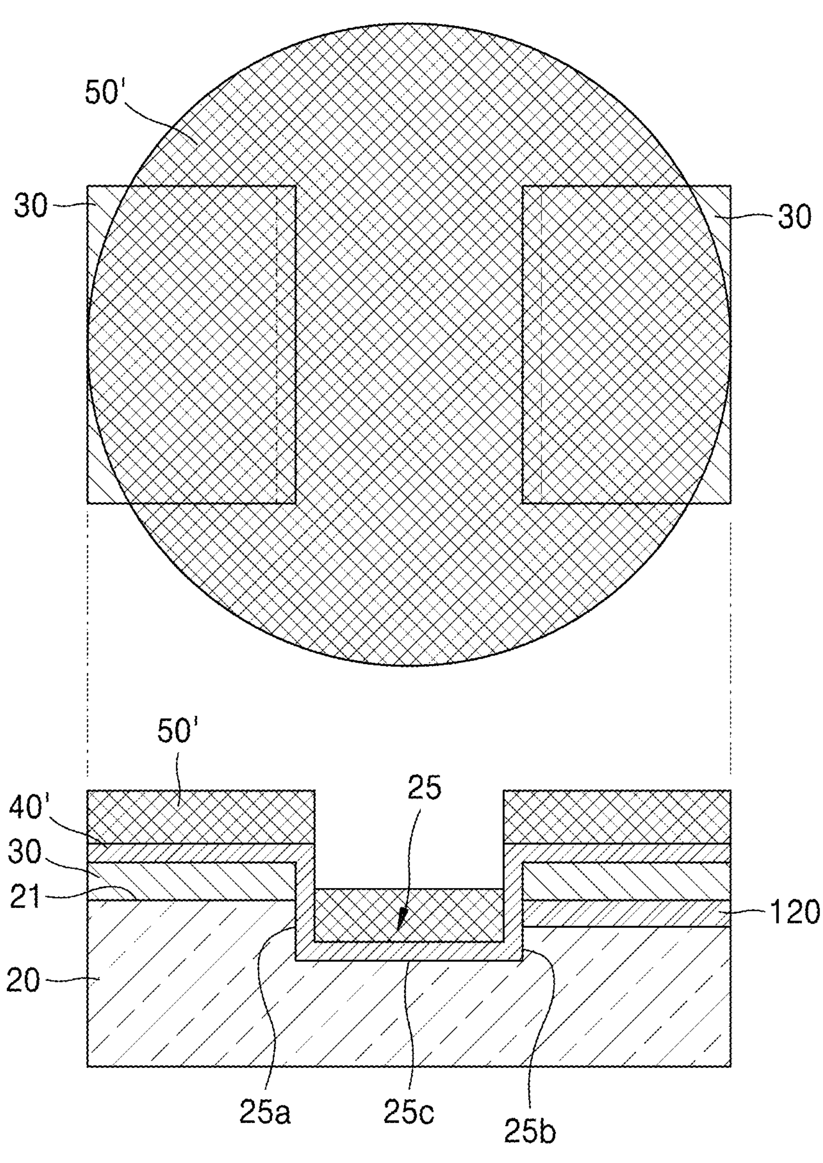
Figure 8H:
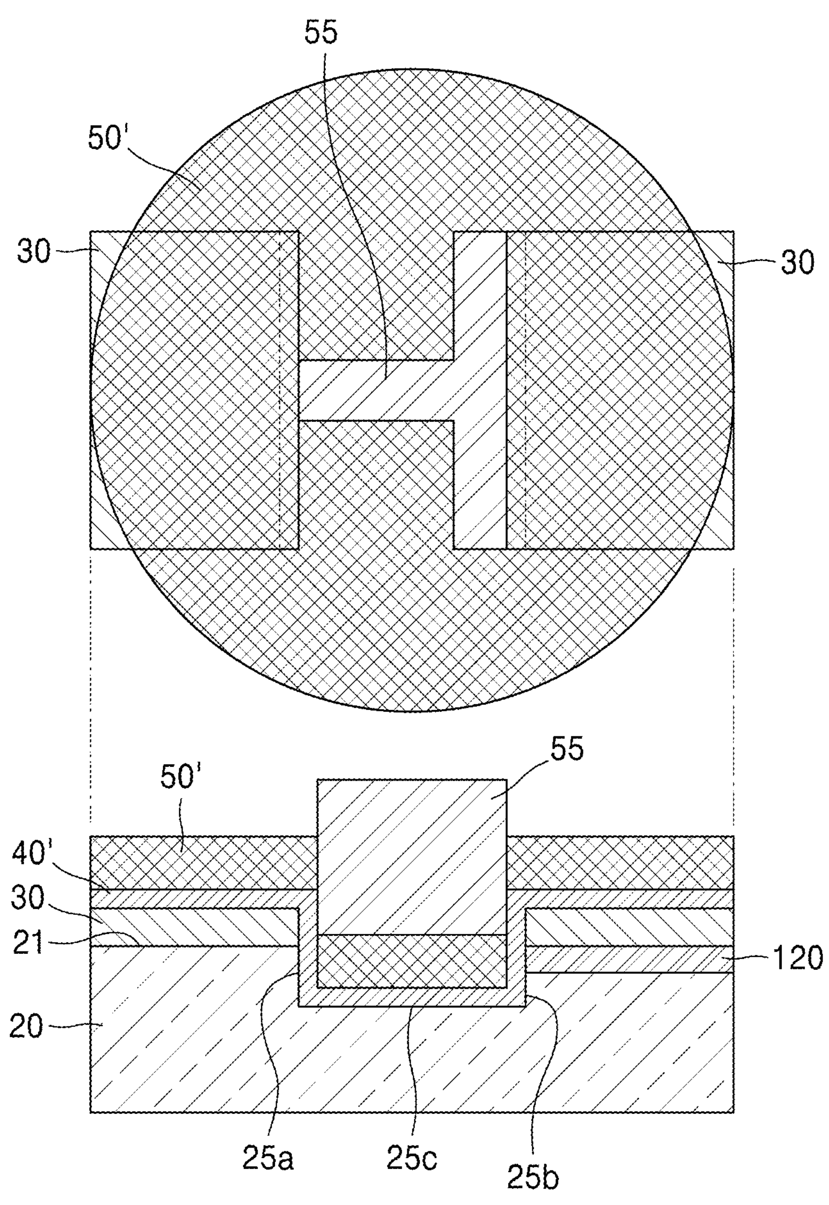
Figure 8I:
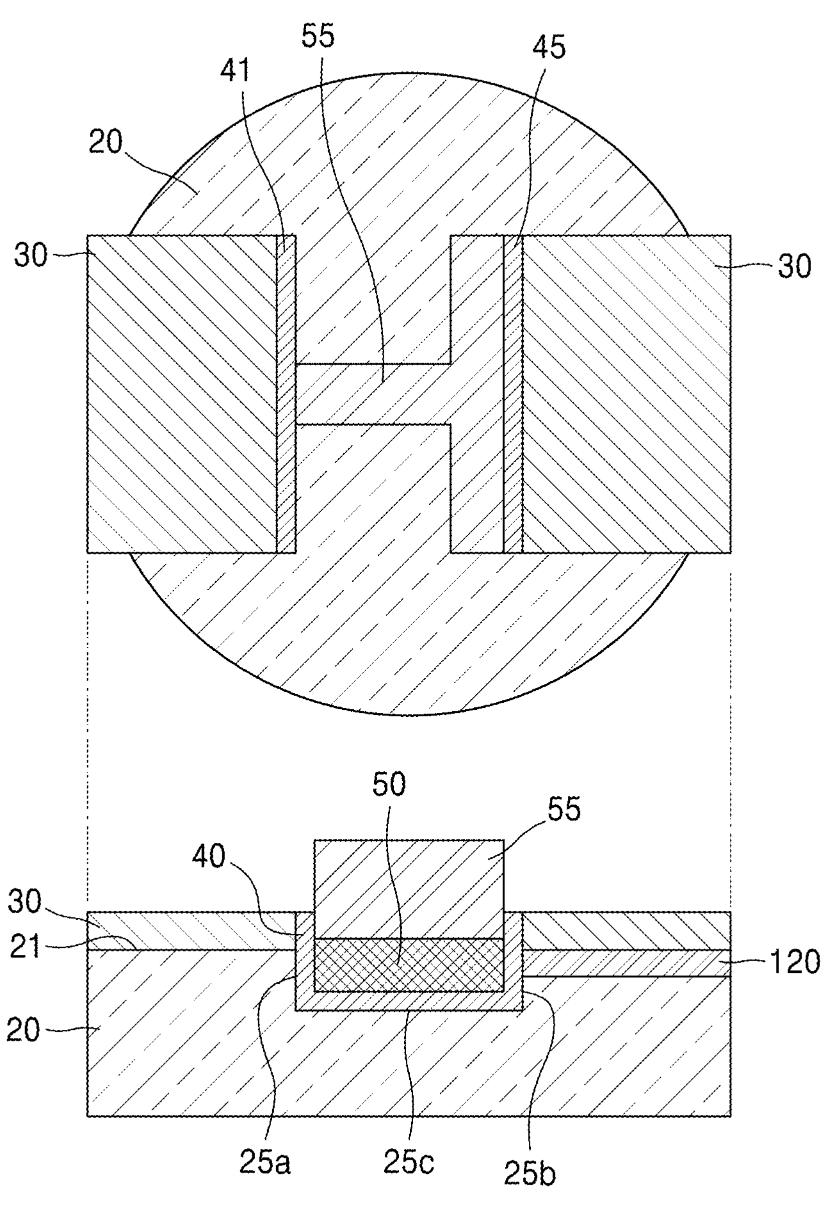
Figure 8J:
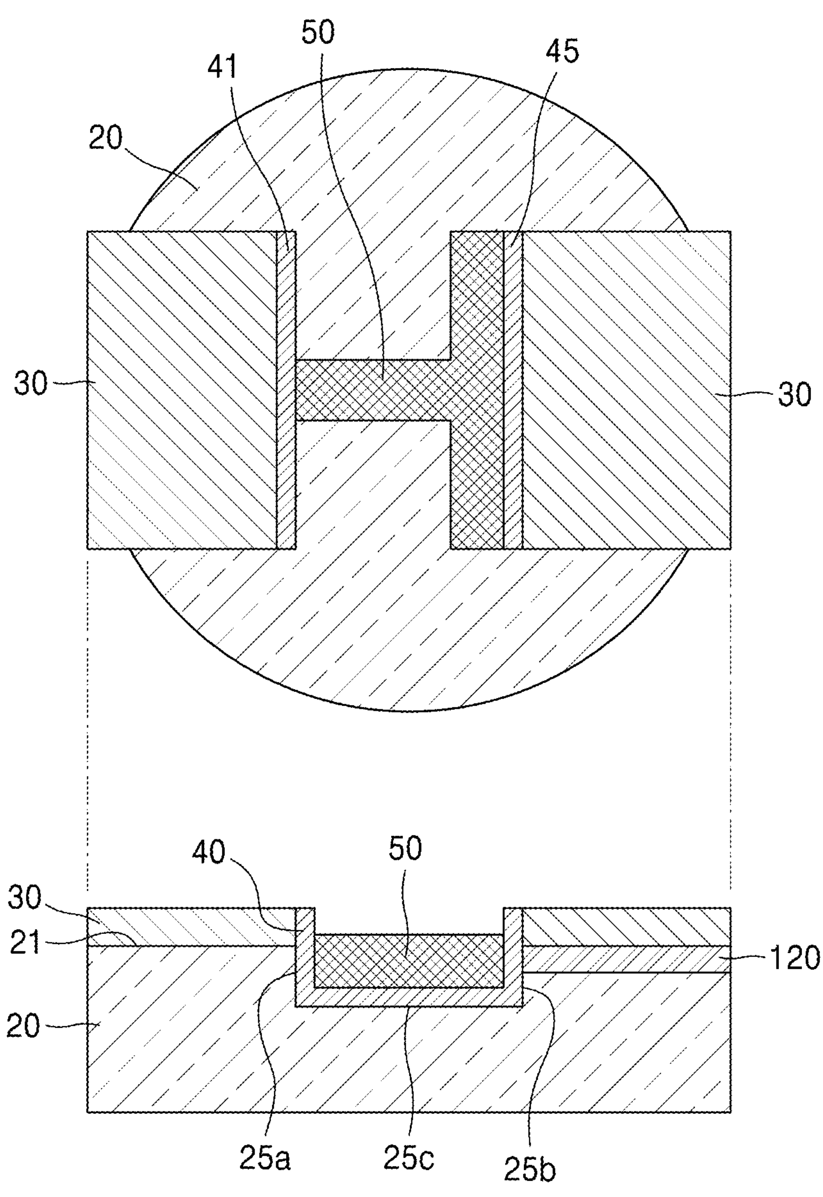
Figure 8K:
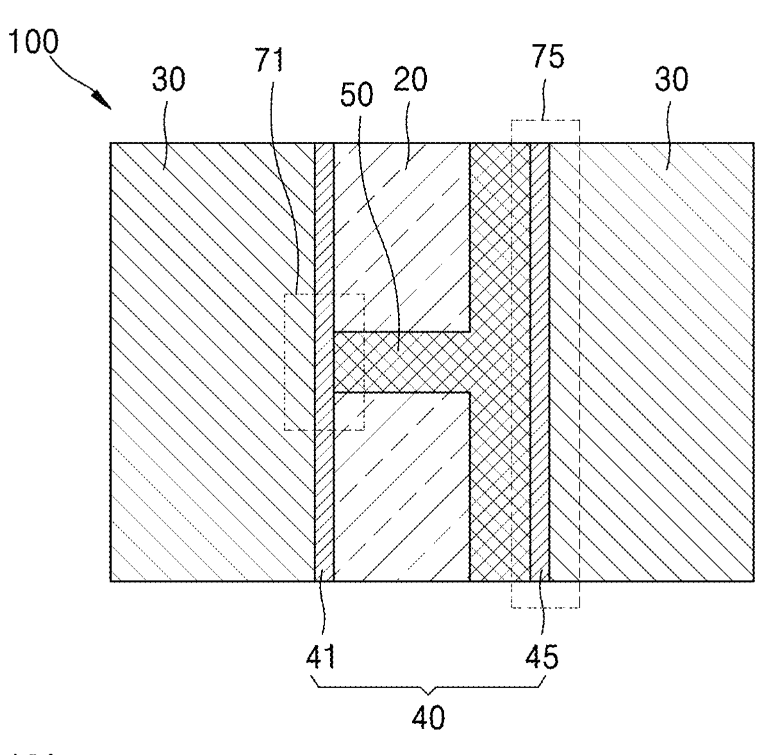
Figure 8K:
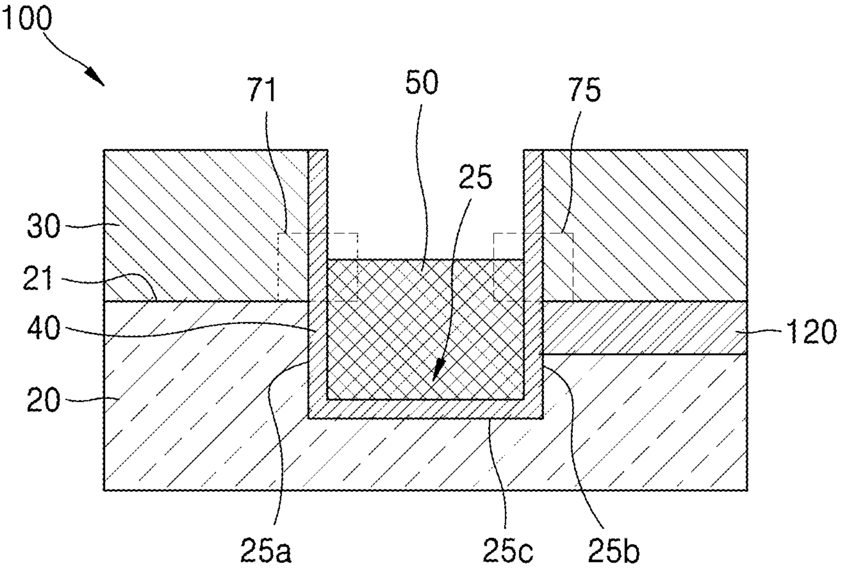

FIGS. 8A to 8K illustrate a process of manufacturing the Josephson junction device 100 according to another embodiment. In each of FIGS. 8A to 8K, the upper half of the Figure is an overhead view and the lower half of the Figure is a cross-sectional view. The process of manufacturing the Josephson junction device 100 according embodiments of FIGS. 8I to 8K is as described above with reference to FIGS. 3A to 3K, except that the conductive layer 120 is formed in a partial region of the substrate 20, and thus, repeated descriptions are omitted. In FIGS. 8A to 8J, the representation of substrate 20 (as applied to manufacturing the Josephson junction device 100) is depicted with a circular shape, however, the circular depiction does not imply the shape of the overall material of the substrate 20, but instead the circular depiction indicates a partial region of the substrate 20. For example, the circular shape may reflect the footprint of overlay materials. FIG. 8K is an enlarged view of the manufactured Josephson junction device 100.

Referring to FIG. 8A, first, the substrate 20 having the first surface 21 is prepared, and the conductive layer 120 is formed in in (or on, in some cases) the substrate 20 in a region corresponding to the position of the second junction 75 (sub junction). The conductive layer 120 may be a region of the substrate 20 that is doped by injecting a doping element through the first surface 21 of the substrate 20. As another example, the conductive layer 120 may be a layer formed after removing a partial thickness of the partial region of the substrate 20. The upper surface of the conductive layer 120 may be even with the first surface 21. The center-facing (from above) sidewall of the conductive layer 120 may be a part of the first sidewall 25*a* of the trench 25 formed in a process described below.

Next, referring to FIG. 8B, the superconducting material layer 30' forming the first superconducting electrode 30 is deposited on the prepared substrate 20. Referring to FIGS. 8C and 8D the mask patterns 35 having a separation distance (from above) corresponding to the width of the trench 25 on the superconducting material layer 30' are applied as shown. The mask patterns cover regions where the first superconducting electrode 30 is to be formed, and an etching process is performed. Accordingly, the superconducting material layer 30' is removed from a region not masked by the mask patterns 35 by etching. That is, the substrate 20 is etched in the region left exposed after the mask patterns 35 are applied by an over-etching process, and thus, the trench 25 is formed recessed into the first surface 21 of the substrate 20. Next, referring to FIG. 8E, the mask patterns 35 are removed.

Through the mask masking/etching process, the trench 25 with both ends open is recessed in the first surface 21 of the substrate 20, thus forming the first superconducting electrode 30 adjacent to the trench 25 and disposed on both sides of the trench 25 on the first surface 21 of the substrate 20. At this time, the first superconducting electrode 30 is formed on the first surface 21 of the substrate 20 on a side of the first sidewall 25*a* of the trench 25, and the first superconducting electrode 30 is formed on the upper surface of the conductive layer 120 on a side of the second sidewall 25*b* of the trench 25.

Next, referring to FIGS. 8F and 8G, the tunneling thin film layer 40' is deposited to cover the first superconducting electrode 30 and the trench 25, and the superconducting material layer 50' is deposited on the tunneling thin film layer 40' to form the second superconducting electrode 50.

The tunneling thin film layer 40' may be formed over the bottom surface 25*c*, the first sidewall 25*a* and the second sidewall 25*b* of the trench 25, and the side and upper surfaces adjacent to the trench 25 of the first superconducting electrode 30. The second sidewall 25*b* may include a portion of the second sidewall 25*b* formed by the substrate 20 and a portion of the second sidewall 25*b* formed by the conductive layer 120. The superconducting material layer 50' may be formed in the trench 25 to be in contact with the tunneling thin film layer 40', and may also be formed on the tunneling thin film layer 40' of the upper surface of the first superconducting electrode 30. When the tunneling thin film layer 40' is not provided on the bottom surface 25*c* of the trench 25, a process of removing the tunneling thin film layer 40' located on the bottom surface 25*c* of the trench 25 may be performed, and then, a process of depositing the superconducting material layer 50' may be performed.

Next, as shown in FIGS. 8H and 8I, the mask pattern 55 for forming the second superconducting electrode 50 is applied, and an etching process is performed. Accordingly, the second superconducting electrode 50 and the tunneling thin film 40 are obtained by removing the superconducting material layer 50' and the tunneling thin film layer 40' where the mask pattern 55 does not cover. The first superconducting electrode 30 may be exposed by the etching process.

Next, referring to FIGS. 8J and 8K, the Josephson junction device 100 is obtained by removing the mask pattern 55.

As described above, as in FIGS. 8J and 8K, the second superconducting electrode 50 may be formed such that (i) the first junction 71 formed with the tunneling thin film 40 on the side of the first sidewall 25*a* of the trench 25 and (ii) the second junction 75 formed with the tunneling thin film 40 on the side of the second sidewall 25*b* have respective different sizes of junction areas.

Accordingly, for example, the mask pattern 55 as shown in FIG. 8H may be formed such that the junction area of the first junction 71 is less than the junction area of the second junction 75, and the etching process and a process of removing the mask pattern 55 may be performed as shown in FIGS. 8I and 8J, thereby forming, as shown in FIG. 8K, the Josephson junction device 100 in which a part of the second superconducting electrode 50 in contact with the tunneling thin film 40 on the side of the first sidewall 25*a* has a small dimension, and a part of the second superconducting electrode 50 in contact with the tunneling thin film 40 on the side of the second sidewall 25*b* has a wider dimension.

At this time, the thickness (from above) of the second superconducting electrode 50 is approximately uniform, and the second superconducting electrode 50 may be formed to have a small end (the bottom end of the "T" shape) in contact with the tunneling thin film 41 on the side of the first sidewall 25*a* of the trench 25, and may be formed to have a wide end (the top of the "T" shape) in contact with the tunneling thin film 45 on the side of the second sidewall 25*b* of the trench 25. The second superconducting electrode 50 may be formed such that the wide end is equal to or more 5 times or equal to or more 10 times than the small end.

Because the junction areas of the first junction 71 and the second junction 75 are different from each other, the first junction 71 (having a relatively small junction area) may function as a main junction where impedance is concentrated, and the second junction 75 (having a relatively large junction area) may have a large conduction value and therefore function as a sub junction.

According to the manufactured Josephson junction device 100, because the conductive layer 120 is provided on a part of the substrate 20 on the second sidewall 25*b* forming the sub junction, concentration of the load on the main junction may be further reinforced.

Meanwhile, FIGS. 8A to 8K illustrate the process of manufacturing the Josephson junction device 100 according to another embodiment of FIGS. 5 and 6. The process may be modified to manufacture the modified example of the Josephson junction device 100 that further includes the protective pattern 60 protecting the tunneling thin film 40 on the first superconducting electrode 30, as shown in FIG. 7.

For example, when the protective pattern 60 is formed together with the second superconducting electrode 50, in a state where the mask pattern 55 for patterning the tunneling thin film layer 40' and the superconducting material layer 50' (as shown in FIG. 8H) is formed to a region covering the protective pattern 60, when the etching process as shown in FIG. 8I is performed, the protective pattern 60 may be formed together with the tunneling thin film 40 and the second superconducting electrode 50. In this regard, the protective pattern 60 may be a portion left during the etching process of the superconducting material layer 50' to form the second superconducting electrode 50.

As another example, when the protective pattern 60 is formed as a layer separate from the superconducting material layer 50' for the second superconducting electrode 50, for example, after depositing the tunneling thin film layer 40', the protective pattern 60 may be formed to cover a portion or more of the tunneling thin film layer 40' formed on the side surface of the first superconducting electrode 30, and the superconducting material layer 50' may be deposited. Then, while forming the tunneling thin film 40 and the second superconducting electrode 50, by forming the mask pattern 55 as shown in FIG. 8H and performing the etching process as shown in FIG. 8I, a structure including the protective pattern 60 on the tunneling thin film 40 at the side surface of the first superconducting electrode 30 may be formed.

Even in the Josephson junction device 100 according to another embodiment, as described above, when the protective pattern 60 is provided, damage to the tunneling thin film 40 on the side surface of the first superconducting electrode 30 during the etching process is prevented, thereby preventing damage to the junction formed between the first and second superconducting electrodes 30 and 50 and the tunneling thin film 40. Thereby, the junction area may be increased, and accordingly, a conduction value of a conduction channel may be increased.

Figure 9:
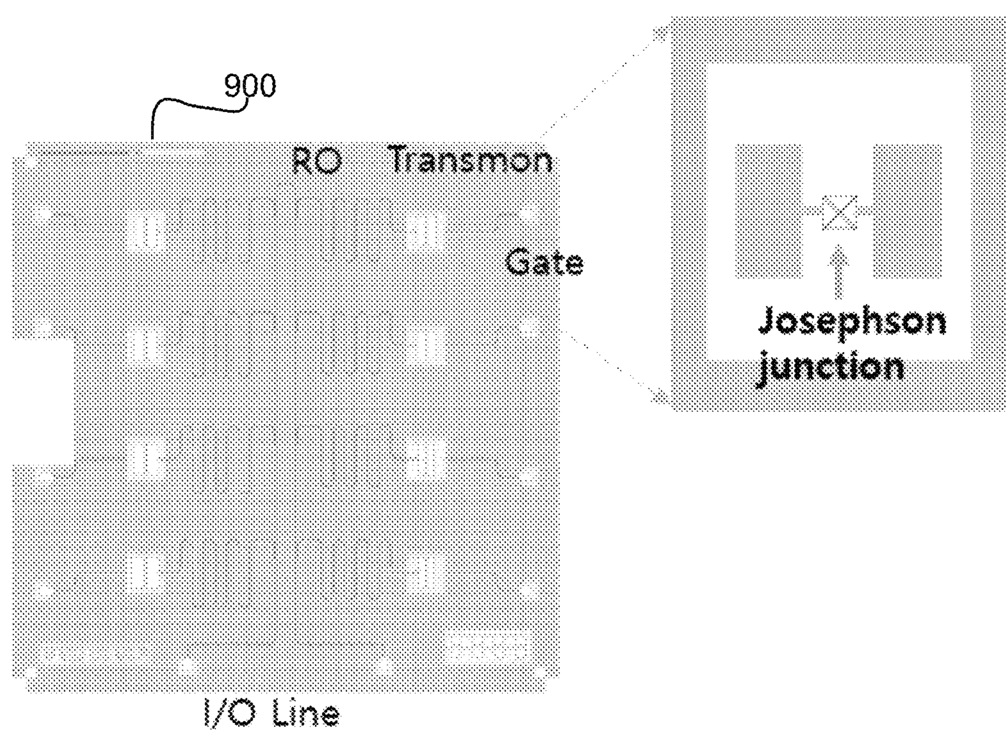
FIG. 9 shows an example of a superconducting qubit device applied a Josephson junction device according to an embodiment.

FIG. 9 shows an example of a superconducting qubit device 900 being applied a Josephson junction device according to one or more embodiments. In addition, the superconducting qubit device may be implemented as, for example, a superconducting qubit chip or may be implemented in another form. FIG. 9 shows an example, and the embodiment is not limited thereto. The superconducting qubit device including the Josephson junction device may be applied to various devices to which a superconducting qubit is applied, for example, a superconducting qubit memory of a quantum computer, a quantum computing device, etc.

Referring to FIG. 9, the superconducting qubit device 900 may include a readout RO, an input/output line (I/O Line), a gate line, and a shunted capacitance of a transmon which are manufactured through a first process of a superconducting thin film, and may include a Josephson junction which is additionally manufactured.

In the first process involving the superconducting thin film, the superconducting thin film may be made of a superconducting material that may be aluminum (Al), titanium nitride (TiN), niobium (Nb), niobium nitride (NbN), and/or titanium niobium nitride (NbTiN).

The Josephson junction may be obtained by additionally manufacturing the Josephson junction device 900 according to the above-described embodiment after the first process of the superconducting thin film. In FIG. 9, the Josephson junction device according to an embodiment may be applied to the indicated position of 'Josephson junction'.

In this regard, in the Josephson junction device 900, the superconducting material layer 30' forming the first superconducting electrode 30 is formed on the first surface 21 of the substrate 20 and then, the first superconducting electrode 30 is formed by patterning the superconducting material layer 30' using the mask pattern 35, and the trench 25 with both ends open is recessed below the first surface 21 of the substrate 20 by an over-etching process, and thus, the first superconducting electrode 30 may be formed by utilizing the first process of the superconducting thin film.

Therefore, according to the superconducting qubit device to which the Josephson junction device 900 is applied, the process of applying/forming the superconducting thin film may be reduced.

In addition, in some embodiments, the Josephson junction device 900 has, for example, titanium nitride (TiN) as the first superconducting electrode 30 and the second superconducting electrode 50. Because titanium nitride (TiN) is a metal utilized in a semiconductor stacked-up structure, the I/O Line and the gate line may be incorporated into the stack-up structure, and thus, when the superconducting qubit device 900 of titanium nitride (TiN) is formed as a multiple superconducting qubit device, it is possible to apply vertical scale up (i.e., repetition of the layered construction techniques described herein) to produce a device with multiple superconducting qubits.

In addition, Josephson junction devices as described above may lower the sensitivity of process errors of the tunneling thin film 40, and thus, crosstalk between frequencies during fabrication of multiple qubits may be improved, thereby producing a multiple superconducting qubit device with the minimized interference between qubit frequencies.

In addition, in Josephson junction devices, according to one or more embodiments, a superconducting material with high superconductivity may be applied as the first superconducting electrode 30 and the second superconducting electrode 50, and the tunnel thin film 40 is formed to be wide, and thus, the process control of a qubit frequency is more practical, thereby more readily implementing a superconducting qubit device having a desired qubit frequency.

The superconducting electrodes of different embodiments may be made of a superconducting material having high superconductivity, so that it is possible to increase the tunnel area or utilize a thick tunneling film, and thus, the sensitivity of process errors of the tunneling film may be lowered, thereby improving crosstalk, and enabling scale up to multiple qubits.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above disclosure, the scope of the disclosure may also be defined by the claims and their equivalents, and all variations within the scope of the claims and their equivalents are to be construed as being included in the disclosure.

What is claimed is:

1. A Josephson junction device comprising:

a substrate having a first surface and a trench recessed below the first surface, wherein sidewalls of the substrate define sidewalls of the trench;

a first superconducting electrode formed on the first surface of the substrate to be adjacent to the trench;

a tunneling thin film formed over the sidewalls of the substrate and over a side surface of the first superconducting electrode adjacent to the trench; and a second superconducting electrode formed in the trench in contact with the tunneling thin film and with a top surface above the first surface of the substrate, wherein a superconducting tunnel junction is formed between the first superconducting electrode and the second superconducting electrode through the tunneling thin film, wherein a top surface of the second superconducting electrode is above the substrate within a height range of the first superconducting electrode.

2. The Josephson junction device of claim 1, wherein a depth of the trench from the first surface of the substrate to a bottom surface of the second superconducting electrode is D1, a distance from the first surface to the top surface of the first superconducting electrode is D2, a vertical thickness of the second superconducting electrode is D3, and the second superconducting electrode satisfies $D1<D3\leq D1+D2$.

3. The Josephson junction device of claim 1, further comprising a protective layer of material protecting the tunneling thin film above the first superconducting electrode.

4. The Josephson junction device of claim 3, wherein the protective layer is formed together with the second superconducting electrode.

5. The Josephson junction device of claim 1, wherein the trench sidewalls include a first sidewall and a second sidewall facing each other, a first junction formed by the tunneling thin film on the first sidewall, and a second junction formed by the tunneling thin film on the second sidewall, wherein the first junction and the second junction have junction areas of different sizes.

6. The Josephson junction device of claim 5, wherein a horizontal width of the second superconducting electrode contacting the tunneling thin film on the first sidewall is different from a width of the second superconducting electrode contacting the tunneling thin film on the second sidewall, so that the junction areas of the first junction and the second junction are different from each other.

7. The Josephson junction device of claim 5, wherein the first junction has a first area of contact between the second superconducting electrode and the tunneling thin film on the first sidewall, wherein the second junction has a second area of contact between the second superconducting electrode and the tunneling thin film on the second sidewall, and wherein the first area and the second area are different from each other by 5 times or greater.

8. The Josephson junction device of claim 7, wherein the first area and the second area are different from each other by 10 times or greater.

9. The Josephson junction device of claim 5, wherein the junction area of the first junction is less than the junction area of the second junction so that the first junction functions as a main junction and the second junction functions as a sub junction.

10. The Josephson junction device of claim 9, further comprising a conductive layer formed by doping a part of the substrate on the side of the second sidewall to reinforce concentration of a load on the main junction.

11. The Josephson junction device of claim 1, wherein the first superconducting electrode or the second superconducting electrode has a vertical thickness less than or equal to about 200 nm.

12. The Josephson junction device of claim 1, wherein the first superconducting electrode or the second superconducting electrode includes titanium nitride, niobium, niobium nitride, or titanium niobium nitride.

13. The Josephson junction device of claim 12, wherein the tunneling thin film includes a metal, a semiconductor, or an insulator.

14. The Josephson junction device of claim 12, wherein the tunneling thin film includes aluminum oxide (AlO), hafnium oxide (HfO), silicon nitride (SiN), or aluminum nitride (AlN).

15. A Josephson junction comprising:

a planar substrate having a first superconducting electrode layered thereon and having a linear groove through the planar substrate and the first superconducting electrode, the linear groove having a left wall comprised of a left portion of the planar substrate and a left portion of the first superconducting electrode, the linear groove also having a right wall comprised of a right portion of the planar substrate and a right portion of the first superconducting electrode;

a tunneling film comprising a left portion lining the left wall of the linear groove and comprising a right portion lining the right wall of the linear groove;

a second superconducting electrode in the linear groove having a left end with a first contact area with the left portion of the tunneling film and having a right end with a second contact area with the right portion of the tunneling film, the second contact area larger than the first contact area.

16. The Josephson junction of claim 15, wherein the tunneling film further comprises a bottom portion lining a surface of the planar substrate that forms a bottom of the linear groove, and wherein a bottom of the second superconducting electrode contacts the bottom portion of the tunneling film.

17. The Josephson junction of claim 15, wherein the second superconducting electrode has an upper surface above the interface between the planar substrate and the first superconducting electrode.

* * * * *